(12) United States Patent
Tarafdar et al.

(10) Patent No.: US 7,790,633 B1
(45) Date of Patent: *Sep. 7, 2010

(54) SEQUENTIAL DEPOSITION/ANNEAL FILM DENSIFICATION METHOD

(75) Inventors: Raihan M. Tarafdar, San Jose, CA (US); George D. Papasouliotis, North Andover, MA (US); Ron Rulkens, Milpitas, CA (US); Dennis M. Hausmann, Lake Oswego, OR (US); Jeff Tobin, Mountain View, CA (US); Adrianne K. Tipton, Pleasanton, CA (US); Bunsen Nie, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 467 days.

This patent is subject to a terminal disclaimer.

(21) Appl. No.: 11/519,445

(22) Filed: Sep. 11, 2006

Related U.S. Application Data

(63) Continuation-in-part of application No. 10/975,028, filed on Oct. 26, 2004, now Pat. No. 7,148,155.

(51) Int. Cl.
*H01L 21/31* (2006.01)
*H01L 21/469* (2006.01)

(52) U.S. Cl. ............ 438/788; 438/799; 257/E21.471; 257/E21.625

(58) Field of Classification Search ........ 438/778, 438/788, 799; 257/E21.471, E21.475, E21.489, 257/E21.625
See application file for complete search history.

(56) References Cited

U.S. PATENT DOCUMENTS

| | | | |
|---|---|---|---|
| 3,983,385 A | 9/1976 | Troue | |
| 4,357,451 A | 11/1982 | McDaniel | |
| 4,391,663 A | 7/1983 | Hutter, III | |
| 4,563,589 A | 1/1986 | Scheffer | |
| 4,885,262 A | 12/1989 | Ting et al. | |
| 5,178,682 A | 1/1993 | Tsukamoto et al. | |
| 5,268,320 A | 12/1993 | Holler et al. | |
| 5,282,121 A | 1/1994 | Bornhorst et al. | |

(Continued)

FOREIGN PATENT DOCUMENTS

JP 01-107519 4/1989

(Continued)

OTHER PUBLICATIONS

Schravendijk, et al., "UV Treatment of STI Films for Stress," Novellus Systems, Inc., U.S. Appl. No. 11/811,048, filed Jun. 7, 2007.

(Continued)

*Primary Examiner*—Caridad M Everhart
(74) *Attorney, Agent, or Firm*—Weaver Austin Villeneuve & Sampson LLP

(57) ABSTRACT

A silicon dioxide-based dielectric layer is formed on a substrate surface by a sequential deposition/anneal technique. The deposited layer thickness is insufficient to prevent substantially complete penetration of annealing process agents into the layer and migration of water out of the layer. The dielectric layer is then annealed, ideally at a moderate temperature, to remove water and thereby fully densify the film. The deposition and anneal processes are then repeated until a desired dielectric film thickness is achieved.

23 Claims, 7 Drawing Sheets

U.S. PATENT DOCUMENTS

| | | | |
|---|---|---|---|
| 5,314,724 A | 5/1994 | Tsukune et al. | |
| 5,504,042 A | 4/1996 | Cho et al. | |
| 5,525,550 A | 6/1996 | Kato | |
| 5,527,561 A | 6/1996 | Dobson | |
| 5,582,880 A | 12/1996 | Mochizuki et al. | |
| 5,597,395 A | 1/1997 | Bocko et al. | |
| 5,686,054 A | 11/1997 | Barthel et al. | |
| 5,700,844 A | 12/1997 | Hedrick et al. | |
| 5,705,028 A | 1/1998 | Matsumoto | |
| 5,789,027 A | 8/1998 | Watkins et al. | |
| 5,851,715 A | 12/1998 | Barthel et al. | |
| 5,855,465 A | 1/1999 | Boitnott et al. | |
| 5,858,457 A | 1/1999 | Brinker et al. | |
| 5,876,798 A | 3/1999 | Vassiliev | |
| 5,877,095 A | 3/1999 | Tamura et al. | |
| 5,985,770 A | 11/1999 | Sandhu et al. | |
| 6,013,155 A | 1/2000 | McMillan et al. | |
| 6,030,881 A | 2/2000 | Papasouliotis et al. | |
| 6,102,993 A | 8/2000 | Bhandari et al. | |
| 6,132,814 A * | 10/2000 | Livesay et al. | 438/787 |
| 6,133,160 A | 10/2000 | Komiyama et al. | |
| 6,136,680 A | 10/2000 | Lai et al. | |
| 6,140,252 A | 10/2000 | Cho et al. | |
| 6,150,272 A | 11/2000 | Liu et al. | |
| 6,184,143 B1 | 2/2001 | Ohashi et al. | |
| 6,228,563 B1 | 5/2001 | Starov et al. | |
| 6,268,288 B1 | 7/2001 | Hautala et al. | |
| 6,270,846 B1 | 8/2001 | Brinker et al. | |
| 6,271,273 B1 | 8/2001 | You et al. | |
| 6,300,219 B1 | 10/2001 | Doan et al. | |
| 6,316,063 B1 | 11/2001 | Andideh et al. | |
| 6,329,017 B1 | 12/2001 | Liu et al. | |
| 6,335,261 B1 | 1/2002 | Natzle et al. | |
| 6,340,628 B1 | 1/2002 | Van Cleemput et al. | |
| 6,352,943 B2 | 3/2002 | Maeda et al. | |
| 6,352,953 B1 | 3/2002 | Seki et al. | |
| 6,365,266 B1 | 4/2002 | MacDougall et al. | |
| 6,372,669 B2 | 4/2002 | Sandhu et al. | |
| 6,383,466 B1 | 5/2002 | Domansky et al. | |
| 6,383,955 B1 | 5/2002 | Matsuki et al. | |
| 6,386,466 B1 | 5/2002 | Ozawa et al. | |
| 6,387,453 B1 | 5/2002 | Brinker et al. | |
| 6,391,932 B1 | 5/2002 | Gore et al. | |
| 6,392,017 B1 | 5/2002 | Chandrashekar | |
| 6,394,797 B1 | 5/2002 | Sugaya et al. | |
| 6,399,212 B1 | 6/2002 | Sakai et al. | |
| 6,420,441 B1 | 7/2002 | Allen et al. | |
| 6,444,715 B1 | 9/2002 | Mukherjee et al. | |
| 6,467,491 B1 | 10/2002 | Sugiura et al. | |
| 6,479,374 B1 | 11/2002 | Ioka et al. | |
| 6,479,409 B2 | 11/2002 | Shioya et al. | |
| 6,485,599 B1 | 11/2002 | Glownia et al. | |
| 6,503,330 B1 | 1/2003 | Sneh et al. | |
| 6,511,539 B1 | 1/2003 | Raaijmakers | |
| 6,531,193 B2 | 3/2003 | Fonash et al. | |
| 6,531,377 B2 | 3/2003 | Knorr et al. | |
| 6,534,395 B2 | 3/2003 | Werkhoven et al. | |
| 6,534,802 B1 | 3/2003 | Schuegraf | |
| 6,540,838 B2 | 4/2003 | Sneh et al. | |
| 6,548,113 B1 | 4/2003 | Birnbaum et al. | |
| 6,551,339 B2 | 4/2003 | Gavronsky | |
| 6,551,399 B1 | 4/2003 | Sneh et al. | |
| 6,558,755 B2 | 5/2003 | Berry et al. | |
| 6,563,092 B1 | 5/2003 | Shrinivasan et al. | |
| 6,576,300 B1 | 6/2003 | Berry et al. | |
| 6,586,349 B1 | 7/2003 | Jeon et al. | |
| 6,596,654 B1 | 7/2003 | Bayman et al. | |
| 6,624,091 B2 | 9/2003 | Yuan | |
| 6,635,575 B1 | 10/2003 | Xia et al. | |
| 6,644,786 B1 | 11/2003 | Leben | |
| 6,677,251 B1 | 1/2004 | Lu et al. | |
| 6,740,602 B1 | 5/2004 | Hendriks et al. | |
| 6,756,085 B2 | 6/2004 | Waldfried et al. | |
| 6,759,098 B2 | 7/2004 | Han et al. | |
| 6,770,866 B2 | 8/2004 | Retschke et al. | |
| 6,780,789 B1 | 8/2004 | Yu et al. | |
| 6,802,944 B2 | 10/2004 | Ahmad et al. | |
| 6,805,801 B1 | 10/2004 | Humayun et al. | |
| 6,812,043 B2 | 11/2004 | Bao et al. | |
| 6,831,284 B2 | 12/2004 | Demos et al. | |
| 6,835,417 B2 * | 12/2004 | Saenger et al. | 427/255.28 |
| 6,848,458 B1 | 2/2005 | Shrinivasan et al. | |
| 6,856,712 B2 | 2/2005 | Fauver et al. | |
| 6,861,334 B2 | 3/2005 | Raaijmakers et al. | |
| 6,867,152 B1 | 3/2005 | Hausmann et al. | |
| 6,867,309 B2 | 3/2005 | Chen et al. | |
| 6,884,738 B2 * | 4/2005 | Asai et al. | 438/758 |
| 6,903,005 B1 | 6/2005 | Marsh | |
| 6,908,862 B2 | 6/2005 | Li et al. | |
| 6,921,727 B2 | 7/2005 | Chiang et al. | |
| 6,958,301 B2 * | 10/2005 | Kim et al. | 438/785 |
| 6,984,591 B1 | 1/2006 | Buchanan et al. | |
| 7,018,918 B2 | 3/2006 | Kloster et al. | |
| 7,030,041 B2 | 4/2006 | Li et al. | |
| 7,094,713 B1 | 8/2006 | Niu et al. | |
| 7,097,878 B1 | 8/2006 | Rulkens et al. | |
| 7,109,129 B1 | 9/2006 | Papasouliotis | |
| 7,129,189 B1 | 10/2006 | Hausmann et al. | |
| 7,132,334 B2 | 11/2006 | Lin | |
| 7,135,418 B1 | 11/2006 | Papasouliotis | |
| 7,148,155 B1 * | 12/2006 | Tarafdar et al. | 438/778 |
| 7,166,531 B1 | 1/2007 | van den Hoek et al. | |
| 7,176,144 B1 | 2/2007 | Wang et al. | |
| 7,208,389 B1 | 4/2007 | Tipton et al. | |
| 7,235,459 B2 * | 6/2007 | Sandhu | 438/427 |
| 7,241,704 B1 | 7/2007 | Wu et al. | |
| 7,247,582 B2 | 7/2007 | Stern et al. | |
| 7,253,125 B1 | 8/2007 | Bandyopadhyay et al. | |
| 7,265,061 B1 | 9/2007 | Cho et al. | |
| 7,332,445 B2 | 2/2008 | Lukas et al. | |
| 7,381,659 B2 | 6/2008 | Nguyen et al. | |
| 7,390,537 B1 | 6/2008 | Wu et al. | |
| 7,481,882 B2 * | 1/2009 | Won et al. | 117/97 |
| 7,504,663 B2 | 3/2009 | Yamazaki et al. | |
| 7,510,982 B1 | 3/2009 | Draeger et al. | |
| 7,611,757 B1 | 11/2009 | Bandyopadhyay et al. | |
| 7,622,162 B1 | 11/2009 | Schravendijk et al. | |
| 2001/0001501 A1 | 5/2001 | Lee et al. | |
| 2001/0014512 A1 | 8/2001 | Lyons et al. | |
| 2001/0049205 A1 | 12/2001 | Sandhu et al. | |
| 2002/0001973 A1 | 1/2002 | Wu et al. | |
| 2002/0016085 A1 | 2/2002 | Huang et al. | |
| 2002/0034626 A1 | 3/2002 | Liu et al. | |
| 2002/0059904 A1 | 5/2002 | Doppelhammer | |
| 2002/0064341 A1 | 5/2002 | Fauver et al. | |
| 2002/0100418 A1 | 8/2002 | Sandhu et al. | |
| 2002/0106500 A1 | 8/2002 | Albano et al. | |
| 2002/0117109 A1 | 8/2002 | Hazelton et al. | |
| 2002/0123218 A1 | 9/2002 | Shioya et al. | |
| 2002/0123230 A1 | 9/2002 | Hubacek | |
| 2002/0123240 A1 | 9/2002 | Gallagher et al. | |
| 2002/0127436 A1 | 9/2002 | Shibamoto et al. | |
| 2002/0157960 A1 | 10/2002 | Dordi et al. | |
| 2002/0172766 A1 | 11/2002 | Laxman et al. | |
| 2002/0195683 A1 * | 12/2002 | Kim et al. | 257/532 |
| 2003/0013280 A1 | 1/2003 | Yamanaka | |
| 2003/0015764 A1 | 1/2003 | Raaijmakers et al. | |
| 2003/0064607 A1 | 4/2003 | Leu et al. | |
| 2003/0068881 A1 | 4/2003 | Xia et al. | |
| 2003/0092241 A1 | 5/2003 | Doan et al. | |
| 2003/0121537 A1 | 7/2003 | Dunn | |
| 2003/0129828 A1 | 7/2003 | Cohen et al. | |
| 2003/0134038 A1 * | 7/2003 | Paranjpe | 427/248.1 |
| 2003/0157248 A1 | 8/2003 | Watkins et al. | |

| | | | |
|---|---|---|---|
| 2003/0157781 | A1 | 8/2003 | Macneil et al. |
| 2003/0228770 | A1 | 12/2003 | Lee et al. |
| 2004/0004247 | A1 | 1/2004 | Forbes et al. |
| 2004/0018319 | A1 | 1/2004 | Waldfried et al. |
| 2004/0022960 | A1* | 2/2004 | Rhee et al. .................. 427/563 |
| 2004/0023513 | A1 | 2/2004 | Aoyama et al. |
| 2004/0025787 | A1 | 2/2004 | Selbrede et al. |
| 2004/0029391 | A1 | 2/2004 | Kirkpatrick et al. |
| 2004/0033662 | A1* | 2/2004 | Lee et al. ................... 438/255 |
| 2004/0043149 | A1 | 3/2004 | Gordon et al. |
| 2004/0044127 | A1 | 3/2004 | Okubo et al. |
| 2004/0058090 | A1 | 3/2004 | Waldfried et al. |
| 2004/0069410 | A1 | 4/2004 | Moghadam et al. |
| 2004/0079728 | A1 | 4/2004 | Mungekar et al. |
| 2004/0096672 | A1 | 5/2004 | Lukas et al. |
| 2004/0099952 | A1 | 5/2004 | Goodner et al. |
| 2004/0101633 | A1 | 5/2004 | Zheng et al. |
| 2004/0102031 | A1 | 5/2004 | Kloster et al. |
| 2004/0166240 | A1 | 8/2004 | Rhee et al. |
| 2004/0185679 | A1 | 9/2004 | Ott et al. |
| 2004/0203254 | A1 | 10/2004 | Conley et al. |
| 2004/0206267 | A1 | 10/2004 | Sambasivan et al. |
| 2004/0224496 | A1* | 11/2004 | Cui et al. .................... 438/626 |
| 2004/0247787 | A1 | 12/2004 | Mackie et al. |
| 2005/0025892 | A1 | 2/2005 | Satoh et al. |
| 2005/0054213 | A1 | 3/2005 | Derderian et al. |
| 2005/0064726 | A1 | 3/2005 | Reid et al. |
| 2005/0112282 | A1* | 5/2005 | Gordon et al. ......... 427/255.18 |
| 2005/0156285 | A1 | 7/2005 | Gates et al. |
| 2005/0170104 | A1 | 8/2005 | Jung et al. |
| 2005/0178336 | A1 | 8/2005 | Liu |
| 2005/0181617 | A1 | 8/2005 | Bosch |
| 2005/0191803 | A1* | 9/2005 | Matsuse et al. ............. 438/202 |
| 2005/0194619 | A1 | 9/2005 | Edelstein et al. |
| 2005/0239264 | A1 | 10/2005 | Jin et al. |
| 2005/0260357 | A1* | 11/2005 | Olsen et al. ................. 427/569 |
| 2005/0272220 | A1 | 12/2005 | Waldfried et al. |
| 2006/0024976 | A1 | 2/2006 | Waldfried et al. |
| 2006/0027929 | A1 | 2/2006 | Cooney et al. |
| 2006/0038293 | A1 | 2/2006 | Rueger et al. |
| 2006/0105106 | A1 | 5/2006 | Balseanu et al. |
| 2006/0118817 | A1 | 6/2006 | Haisma |
| 2006/0145304 | A1 | 7/2006 | Boyanov et al. |
| 2006/0220251 | A1 | 10/2006 | Kloster |
| 2006/0246672 | A1 | 11/2006 | Chen et al. |
| 2006/0260538 | A1 | 11/2006 | Ye et al. |
| 2007/0054504 | A1 | 3/2007 | Chen et al. |
| 2007/0132054 | A1 | 6/2007 | Arghavani et al. |
| 2007/0134907 | A1 | 6/2007 | Ikeda et al. |
| 2007/0275569 | A1* | 11/2007 | Moghadam et al. ......... 438/781 |
| 2007/0281497 | A1 | 12/2007 | Liu et al. |
| 2007/0287240 | A1 | 12/2007 | Chen et al. |
| 2008/0009141 | A1 | 1/2008 | Dubois et al. |
| 2008/0020591 | A1 | 1/2008 | Balseanu et al. |
| 2008/0132055 | A1 | 6/2008 | Nguyen et al. |
| 2008/0199977 | A1 | 8/2008 | Weigel et al. |
| 2008/0305600 | A1 | 12/2008 | Liao et al. |
| 2009/0017640 | A1 | 1/2009 | Huh et al. |

FOREIGN PATENT DOCUMENTS

| | | |
|---|---|---|
| JP | 5-308071 A | 11/1993 |
| JP | 2004-256479 | 9/2004 |
| JP | 63-307740 | 12/2008 |
| KR | 2000-0043888 | 7/2000 |
| WO | WO02/27063 | 4/2002 |
| WO | WO03/083167 A1 | 9/2003 |
| WO | 2006/104583 | 10/2006 |
| WO | 2006/127463 | 11/2006 |

OTHER PUBLICATIONS

Arghavani et al., *Strain Engineering in Non-Volatile Memories*, Reed Business Information, 2007, six pages.

Notice of Allowance and Fee Due mailed May 22, 2006, from U.S. Appl. No. 10/672,311.

Allowed Claims from U.S. Appl. No. 10/672,311.

Notice of Allowance and Fee Due mailed Apr. 4, 2007, from U.S. Appl. No. 10/825,888.

Allowed Claims from U.S. Appl. No. 10/825,888.

Bandyopadhyay et al., "Method to Improve Mechanical Strength of Low-K Dielectric Film Using Modulated UV Exposure," Novellus Systems, Inc., U.S. Appl. No. 11/824,049, filed Jun. 28, 2007.

Notice of Allowance and Fee Due mailed Oct. 10, 2006, from U.S. Appl. No. 10/800,377.

Allowed Claims from U.S. Appl. No. 10/800,377.

U.S. Office Action mailed Nov. 28, 2007, from U.S. Appl. No. 10/807,680.

R.J. Lewis, Sr., Hawley's Condensed Chemical Dictionary, $12^{th}$ Edition, Van Nostrad Reinhold Co., New York, 1993 (no month), excerpts pp. 916-918 & 1123-1124.

Notice of Allowance and Fee Due mailed Dec. 20, 2005, from U.S. Appl. No. 10/860,340.

Allowed Claims from U.S. Appl. No. 10/860,340.

U.S. Office Action mailed Dec. 12, 2007, from U.S. Appl. No. 11/146,456.

U.S. Office Action mailed Oct. 3, 2007, from U.S. Appl. No. 11/115,576.

Shaviv et al., "UV Treatment to Improve Integrity and Performance of Front End Dielectrics," Novellus Systems, Inc., U.S. Appl. No. 11/622,409, filed Jan. 11, 2007.

van Schravendijk et al., "UV Treatment for Carbon-Containing Low-K Dielectric Repair in Semiconductor Processing," Novellus Systems, Inc., U.S. Appl. No. 11/590,661, filed Oct. 30, 2006.

Shrinivassan et al., "Multi-Station Sequential Curing of Dielectric Films," Novellus Systems, Inc., U.S. Appl. No. 11/688,695, filed Mar. 20, 2007.

Varadarajan et al., "A Cascaded Cure Approach to Fabricate Highly Tensile Silicon Nitride Films," Novellus Systems, Inc., U.S. Appl. No. 11/897,838, filed Aug. 31, 2007.

Van den Hoek, et al., "VLSI Fabrication Processes for Introducing Pores Into Dielectric Materials," Novellus Systems, Inc., U.S. Appl. No. 11/606,340, filed Nov. 28, 2006.

U.S. Office Action mailed Jan. 10, 2008, from U.S. Appl. No. 11/622,423.

Bhadri Varadarajan et al., "Development of High Stress SiN Films for Use with Strained Silicon Technologies"; Proc. $68^{th}$ Symp. On Semiconductors and IC Tech.; Kyoto 2005.

U.S. Office Action mailed Jan. 30, 2007, from U.S. Appl. No. 10/890,376.

Johanson et al., "Apparatus and Method for Delivering Uniform Fluid Flow in a Chemical Deposition System," Novellus Systems, Inc., U.S. Appl. No. 11/542,959, filed Oct. 3, 2006, pp. 1-26.

Lind, et al., "Dual Seal Process Chamber and Process," Novellus Systems, Inc., U.S. Appl. No. 11/542,723, filed Oct. 3, 2006, pp. 1-41.

Krotov et al., "Deposition Sub-Chamber with Variable Flow," Novellus Systems, Inc., U.S. Appl. No. 11/626,328, filed Jan. 23, 2007, pp. 1-34.

PCT patent application No. PCT/US07/15979, International Search Report and Written Opinion dated Jan. 10, 2008.

Cho et al., "Plasma Treatments of Molecularly Templated Nanoporous Silica Films," Electrochemical and Solid-State Letters, 4 (4) G35-G38 (2001).

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

Watkins et al., "Mesoporous Materials and Methods," U.S. Appl. No. 10/301,013, filed Nov. 21, 2002, 34 Pages.

Justin F. Gaynor, "In-Situ Treatment of Low-K Films With a Silylating Agent After Exposure to Oxidizing Environments," U.S. Appl. No. 10/056,926 filed Jan. 24, 2002, 34 Pages.

Tipton et al., "Method of Porogen Removal From Porous Low-K Films Using UV Radiation", Novellus Systems, Inc., U.S. Appl. No. 10/672,311, filed Sep. 26, 2003, pp. 1-27.

Jan, C.H., et al, *90NM Generation, 300mm Wafer Low k ILD/Cu Interconnect Technology*, 2003 IEEE Interconnect Technology Conference.

Gangpadhyay et al., "The First International Surface Cleaning Workshop," Northeastern University, Nov. 11-14, 2002.

Cho et al., "Method and Apparatus for UV Exposure of Low Dielectric Constant Materials for Porogen Removal and Improved Mechanical Properties", Novellus Systems, Inc., U.S. Appl. No. 10/800,377, filed Mar. 11, 2004, pp. 1-31.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

Tipton et al., "Method of Porogen Removal From Porous Low-K Films Using UV Radiation", U.S. Appl. No. 10/672,311, filed Sep. 26, 2003, Office Action dated Sep. 7, 2004.

Tipton et al., "Method of Porogen Removal From Porous Low-K Films Using UV Radiation", U.S. Appl. No. 10/672,311, filed Sep. 26, 2003, Office Action dated Dec. 28, 2004.

Bandyopadhyay et al., "Method to Improve Mechanical Strength of Low-K Dielectric Film Using Modulated UV Exposure", U.S. Appl. No. 10/825,888, filed Apr. 16, 2004.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

Niu et al., "Methods For Improving The Cracking Resistance Of Low-K Dielectric Materials", U.S. Appl. No. 10/860,340, Office Action dated Mar. 2, 2005.

Niu et al., "Methods For Improving the Cracking Resistance of Low-K Dielectric Materials", U.S. Appl. No. 10/860,340, Final Office Action dated Jun. 13, 2005.

Varadarajan et al., "Tensile Dielectric Films Using UV Curing", U.S. Appl. No. 10/972,084, filed Oct. 22, 2004.

Draeger et al., "Creation of Porosity In Low-K Films by Photo-Disassociation Of Imbedded Nanoparticles," U.S. Appl. No. 11/146,456, filed Jun. 6, 2005.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

U.S. Office Action mailed Jul. 13, 2005, from U.S. Appl. No. 10/672,311.

U.S. Office Action mailed Dec. 20, 2005, from U.S. Appl. No. 10/672,311.

U.S. Office Action mailed Mar. 29, 2006, from U.S. Appl. No. 10/800,377.

Kelman et al., "Method for Reducing Stress in Porous Dielectric Films", U.S. Appl. No. 11/369,311, filed Mar. 6, 2006.

U.S. Office Action mailed Jun. 28, 2006, from U.S. Appl. No. 10/825,888.

U.S. Office Action mailed Dec. 27, 2006, from U.S. Appl. No. 10/825,888.

Cho et al., "Method and Apparatus for UV Exposure of Low Dielectric Constant Materials for Porogen Removal and Improved Mechanical Properties", Novellus Systems, Inc., U.S. Appl. No. 11/656,661, filed Jan. 22, 2007, pp. 1-28.

Shrinivasan et al., "Single-Chamber Sequential Curing of Semiconductor Wafers," Novellus Systems, Inc., U.S. Appl. No. 11/115,576, filed Apr. 26, 2005, pp. 1-29.

Kamian et al., "UltraViolet Light Treatment Load Lock for Dielectric Films," Novellus Systems, Inc., U.S. Appl. No. 11/561,834, filed Nov. 20, 2006, pp. 1-25.

Schravendijk et al., "UV Treatment of Etch Stop and Hard Mask Films for Selectivity and Hermeticity Enhancement," Novellus Systems, Inc., U.S. Appl. No. 11/696,102, filed Apr. 3, 2007, pp. 1-22.

Vancouver et al., "PECVD Methods for Producing Ultra Low-K Dielectric Films Using UV Treatment," U.S. Appl. No. 11/608,056, filed Dec. 7, 2006, pp. 1-34.

Schravendijk, "UV Treatment of FSG Films to Improve Film Stability," Novellus Systems, Inc., U.S. Appl. No. 11/622,423, filed Jan. 11, 2007, pp. 1-31.

U.S. Office Action mailed May 31, 2005, from U.S. Appl. No. 10/746,274.

Hausmann et al., "Plasma Treatments to Improve the Properties of Silica Thin Films Produced by a Rapid Vapor Deposition (RVD)", Novellus Systems, Inc., filed Dec. 23, 2000, U.S. Appl. No. 10/746,274, pp. 1-29.

Greer et al., "Method and Apparatus to Reduce the Frequency of Chamber Cleans in Rapid Vapor Deposition (RVD) of Silicon Oxide", Novellus Systems, Inc., filed Jul. 12, 2004, U.S. Appl. No. 10/890,376, pp. 1-25.

Hausmann et al., "Silica Thin Films Produced by Rapid Surface Catalyzed Vapor Deposition (RVD) Using a Nucleation Layer", Novellus Systems, Inc., filed Jun. 22, 2004, U.S. Appl. No. 10/875,158, pp. 1-25.

U.S. Office Action mailed Sep. 22, 2005, from U.S. Appl. No. 10/874,814.

Rulkens et al., "Mixed Alkoxy Precursors and Methods of Their Use for Rapid Vapor Deposition of $SiO_2$ Films", Novellus Systems, Inc., filed Jun. 22, 2004, U.S. Appl. No. 10/874,814, pp. 1-26.

U.S. Office Action mailed Jun. 23, 2005, from U.S. Appl. No. 10/874,808.

Hausmann et al., "Aluminum Phosphate Incorporation in Silica Thin Films Produced by Rapid Surface Catalyzed Vapor Deposition (RVD)", Novellus Systems, Inc., filed Jun. 22, 2004, U.S. Appl. No. 10/874,808, pp. 1-21.

Gaillard et al., "Silicon dioxide chemical vapor deposition using silane and hydrogen peroxide", Rapid Communications, J. Vac. Sci. Technol. B 14(4), Jul./Aug. 1996, pp. 2767-2769.

Beekmann, et al., "Properties of posttreated low κ flowfill™ films and their stability after etch, resist and polymer strip processes", Microelectronic Engineering 55(2001), pp. 73-79.

Roland et al., "Theoretical Modeling of $SiO_2$ Photochemical Vapor Deposition and Comparison to Experimental Results for Three Oxidant Chemistries: $SiH_4+O_2$, $H_2O/O_2$, and $H_2O_2$", Chem Mater 2001, 13, 2501-2510.

Roland et al., "Low Temperature Photochemical Vapor Deposition of SiO2 Using 172 nm Xe2* Excimer Lamp Radiation with Three Oxidant Chemistries: $O_2$, $H_2O/O_2$, and $H_2O_2$", Chem Mater 2001, 13, 2493-2500.

Moore et al., "Reaction of hydrogen peroxide with organosilanes under chemical vapour deposition conditions", J. Chem. Soc., Dalton Trans., 2000, 2673-2677.

Gaillard et al., "Effect of plasma and thermal annealing on chemical vapor deposition dielectrics grown using $SIH_4$-$H_2O_2$ gas mixtures", J. Vac. Sci. Technol. A 15(5), Sep./Oct. 1997, pp. 2478-2484.

Taylor et al., "Studies on the reaction between silane and hydrogen peroxide vapour; surface formation of planarized silica layers", J. Chem. Soc., Dalton Trans., 1997, pp. 1049-1053.

Xia et al., "High Aspect Ratio Trench Filling Using Two-Step Subatmospheric Chemical Vapor Deposited Borophosphosilicated Glass for <0.18 μ m Device Application", Journal of The Electrochemical Society, 146 (5) 1884-1888 (1999).

Xia et al., "High Temperature Subatmospheric Chemical Vapor Deposited Undoped Silicated Glass—A Solution for Next Generation Shallow Trench Isolation", Journal of the Electrochemical Society, 146 (3) 1181-1185 (1999).

Arno et al., "Fourier Transform Infrared Characterization of Downstream Gas-Phase Species Generated by Tetraethylorthosilicate/Ozone Atmospheric Pressure Reactions", Journal of The Electrochemical Society, 146 (1) 276-280 (1999).

Romet et al., "Modeling of Silicon Dioxide Chemical Vapor Deposition from Tetraethoxysilane and Ozone", Journal of The Electrochemical Society, 148 (2) G82-G90 (2001).

Ikeda et al., "The Effects of Alkoxy Functional Groups on Atmospheric-Pressure Chemical Vapor Deposition Using Alkoxysilane and Ozone", J. Electrochem. Soc., vol. 142, No. 5, May 1995, pp. 1659-1662.

"Customer A low k Gapfill Trikon FlowFill vs FHDP", Novellus Systems, Inc., pp. 1-12.

Rulkens et al., "Methods for the Use of Alkoxysilanol Precursors for Vapor Deposition of SiO₂ Films", Novellus Systems, Inc., filed Dec. 23, 2004, U.S. Appl. No. 11/021,558, pp. 1-24.
Papasouliotis et al., "Dynamic Rapid Vapor Deposition Process for Conformal Silica Laminates", Novellus Systems, Inc., filed Dec. 30, 2004, U.S. Appl. No. 11/027,480, pp. 1-29.
Papasouliotis et al., "Multi-Step Nanolaminate Dielectric Deposition and Etch Back Gap Fill Process", Novellus Systems, Inc., filed Dec. 30, 2004, U.S. Appl. No. 11/026,563, pp. 1-28.
Rulkens et al., "Chamber and Chamber Surface Materials to Inhibit Deposition and Methods of Making Same", Novellus Systems, Inc., filed Dec. 23, 2004, U.S. Appl. No. 11/027,388, pp. 1-26.
Papasouliotis et al., "Methods for Forming High Density, Conformal, Silica Nanolaminate Films Via Pulsed Deposition Layer In Structures of Confined Geometry", Novellus Systems, Inc., filed Dec. 30, 2004, U.S. Appl. No. 11/026,284, pp. 1-24.
Papasouliotis, George D., "Optimal Operation of Conformal Silica Deposition Reactors", Novellus Systems, Inc., U.S. Appl. No. 11/077,198, filed Mar. 9, 2005, pp. 1-32.
Papasouliotis, George D., "Optimal Operation of Conformal Silica Deposition Reactors", Novellus Systems, Inc., U.S. Appl. No. 11/077,108, filed Mar. 9, 2005, pp. 1-31.
Cho et al., "Hydroxyl Bond Removal and Film Densification Method for Oxide Films Using Microwave Post Treatment", Novellus Systems, Inc., Appln. No. Not yet assigned, filed Nov. 15, 2005, pp. 1-27.
U.S. Office Action mailed Nov. 10, 2005, from U.S. Appl. No. 11/021,558.
Penka et al., "Integration Aspects of Flowfill and Spin-on-Glass Process for Sub-0.35μm Interconnects", pp. 1-3.
Hockele et al., "Flowfill-Process as a New Concept for Inter-Metal-Dielectrics", Siemens AG, Semiconductor Group, 1998, pp. 235-238.
Robl et al., "Integration of Flowfill® and Forcefill® for cost effective via applications" Sep. 1999, pp. 77-83.
Dennis Michael Hausmann, "Atomic Layer Deposition of Metal Oxide Thin Films," A thesis presented by, Harvard University, 186 pages, Jul. 2002.
Hausmann et al., "Rapid Vapor Deposition of Highly Conformal Silica Nanolaminates," Science, vol. 308, Oct. 2002, 5 Pages.
Gordon et al., "A Kinetic Model for Step Coverage by Atomic Layer Deposition in Narrow Holes or Trenches", Chemical Vapor Deposition 2003, 9, No. 2, pp. 73-78.
Papasouliotis et al., "Method for Controlling Properties of Conformal Silica Nanolaminates Formed by Rapid Vapor Deposition", Novellus Systems, Inc., U.S. Appl. No. 10/874,696, filed Jun. 22, 2004, pp. 1-29.
Ritala et al., "Atomic Layer Deposition", Handbook of Thin Films Materials, vol. 1, 2002, pp. 103-159.
U.S. Office Action mailed Feb. 24, 2006, from U.S. Appl. No. 11/077,108.
U.S. Office Action mailed Dec. 30, 2005, from U.S. Appl. No. 11/026,284.
U.S. Office Action mailed Dec. 22, 2005, from U.S. Appl. No. 11/026,563.
Papasouliotis et al., "Metal-Free Catalysts for Pulsed Deposition Layer Process for Conformal Silica Laminates", Novellus Systems, Inc., U.S. Appl. No. 11/318,268, filed Dec. 23, 2005, pp. 1-30.
Cho et al., "Localized Energy Pulse Rapid Thermal Anneal Dielectric Film Densification Method", Novellus Systems, Inc., U.S. Appl. No. 11/327,668, filed Jan. 5, 2006, pp. 1-28.
Papasouliotis et al., "Reactive Seam Healing Methods for Improving Film Integrity in Structures of Confined Geometry", Novellus Systems, Inc., U.S. Appl. No. 11/334,762, filed Jan. 17, 2006, pp. 1-24.
U.S. Office Action mailed Dec. 5, 2005, from U.S. Appl. No. 10/746,274.
U.S. Office Action mailed Dec. 7, 2005, from U.S. Appl. No. 10/874,808.
U.S. Office Action mailed Oct. 6, 2005, from U.S. Appl. No. 10/975,028.
Tarafdar et al., "Sequential Deposition/Anneal Film Densification Method", Novellus Systems, Inc., filed Oct. 26, 2004, U.S. Appl. No. 10/975,028, pp. 1-34.
U.S. Office Action mailed Mar. 24, 2006, from U.S. Appl. No. 10/975,028.
U.S. Office Action mailed Apr. 25, 2006, from U.S. Appl. No. 11/021,558.
U.S. Office Action mailed May 23, 2006, from U.S. Appl. No. 11/077,198.
U.S. Office Action mailed May 24, 2006, from U.S. Appl. No. 11/026,284.
U.S. Office Action mailed May 31, 2006, from U.S. Appl. No. 11/026,563.
U.S. Office Action mailed May 15, 2006, from U.S. Appl. No. 11/027,480.
U.S. Office Action mailed Jul. 7, 2007, from U.S. Appl. No. 10/875,158.
U.S. Office Action mailed Apr. 3, 2008, from U.S. Appl. No. 10/982,654.
U.S. Office Action mailed Sep. 19, 2008, from U.S. Appl. No. 11/824,049.
U.S. Final Office Action mailed Jul. 10, 2008, from U.S. Appl. No. 10/807,680.
U.S. Final Office Action mailed Jul. 25, 2008, from U.S. Appl. No. 11/146,456.
U.S. Final Office Action mailed Jul. 9, 2008, from U.S. Appl. No. 10/982,654.
U.S. Final Office Action mailed May 2, 2008, from U.S. Appl. No. 11/115,576.
U.S. Office Action mailed Oct. 17, 2008, from U.S. Appl. No. 11/115,576.
U.S. Office Action mailed Jul. 23, 2008, from U.S. Appl. No. 11/622,423.
U.S. Appl. No. 11/590,661, Office Action mailed Apr. 6, 2009.
U.S. Appl. No. 11/811,048, Office Action mailed Mar. 19, 2009.
Rodriquez, J.A. et al., "Evolution of the mechanical stress on PECVD silicon oxide films under thermal processing", Journal of Materials Science Letters 19, 2000, pp. 1399-1401, (year 2000).
U.S. Appl. No. 11/606,340, Office Action mailed Feb. 5, 2009.
U.S. Appl. No. 11/824,049, Office Action mailed Mar. 19, 2009.
U.S. Appl. No. 11/824,049, Notice of Allowance mailed Jun. 22, 2009.
U.S. Appl. No. 11/824,049, Allowed Claims, (Jun. 2007).
U.S. Appl. No. 10/982,654, Office Action mailed Dec. 4, 2008.
U.S. Appl. No. 10/972,084, Office Action mailed Dec. 30, 2008.
U.S. Appl. No. 11/115,576, Office Action mailed Apr. 22, 2009.
Draeger et al., "Creation of Porosity in Low-K Films by Photo-Disassociation of Imbedded Nanoparticles," U.S. Appl. No. 12/369,384, filed Feb. 11, 2009.
U.S. Appl. No. 11/688,695, Office Action mailed Jun. 11, 2009.
U.S. Appl. No. 11/696,102, Office Action mailed Jul. 1, 2009.
Yu, J.J. et al., "UV Annealing of Ultrathin Tantalum Oxide Films", Applied Surface Science, V 186 (2002), 57-63, (year 2002).
U.S. Appl. No. 11/811,048, Notice of Allowance mailed Aug. 17, 2009.
U.S. Appl. No. 11/811,048, Allowed Claims, (Aug. 2009).
U.S. Appl. No. 11/369,311, Office Action mailed Aug. 20, 2009.
U.S. Appl. No. 11/608,056, Office Action mailed Aug. 20, 2009.
Varadarajan et al., "Tensile dielectric films using UV curing", U.S. Appl. No. 10/972,084, filed Oct. 22, 2004.
P. Morin et al., "Tensile contact etch stop layer for nMOS performance enhancement: influence of the film morphology", ECS meeting, May 2005.
Takagi et al., "High Rate Deposition of a-Si:H and a-SiN$_x$:H by VHF PECVD", Vacuum, 51, 1998.
Smith, D.L et al., "Mechanism of SiN$_3$-SiH$_4$ Llasma", J. Electrochem. Soc., vol. 137 (2) 1990.
Nagayoshi et al., "Residual Stress of a Si$_{1-x}$N$_x$: H Films Prepared by Afterglow Plasma Chemical Vapor Deposition Technique", Jpn. J. Appl. Phys. vol. 31 (1992) pp. L867-L869 Part 2, No. 7A, Jul. 1, 1992.
Varadarajan et al., "Use of VHF RF plasma to deposit high tensile stress films with improved film properties for use in strained silicon technology", U.S. Appl. No. 11/975,473, filed Oct. 18, 2007.
U.S. Appl. No. 11/975,473, Office Action mailed Oct. 28, 2008.
U.S. Appl. No. 11/975,473, Office Action mailed Mar. 23, 2009.

Jiang et al., "Tensile dielectric films using UV curing", U.S. Appl. No. 11/899,683, filed Sep. 7, 2007.
U.S. Appl. No. 11/899,683, Office Action mailed May 29, 2009.
U.S. Appl. No. 11/622,409, Office Action mailed Jul. 1, 2009.
Haverkamp et al., "Enhancing adhesion of cap layer films", U.S. Appl. No. 11/731,581, filed Mar. 30, 2007.
U.S. Appl. No. 11/731,581, Office Action mailed Jun. 1, 2009.
U.S. Appl. No. 11/115,576, Office Action mailed Oct. 1, 2009.
U.S. Appl. No. 11/811,048, Notice of Allowance mailed Oct. 8, 2009.
U.S. Appl. No. 11/975,473, Office Action mailed Oct. 9, 2009.
Bandyopadhyay et al., "Method to Improve Mechanical Strength of Low-K Dielectric Film Using Modulated UV Exposure," Novellus Systems, Inc., U.S. Appl. No. 12/566,514, filed Sep. 24, 2009.
U.S. Appl. No. 10/972,084, Office Action mailed Nov. 27, 2009.
Haverkamp, et al., "Multi-Station Sequential Curing of Dielectric Films," Novellus Systems, Inc., U.S. Appl. No. 11/977,792, filed Oct. 25, 2007.
Haverkamp, et al., "Progressive Uv Cure," Novellus Systems, Inc., U.S. Appl. No. 12/210,060, filed Sep. 12, 2008.
U.S. Appl. No. 11/696,102, Final Office Action mailed Dec. 22, 2009.
U.S. Appl. No. 11/369,311, Office Action mailed Jan. 5, 2010.
U.S. Appl. No. 11/688,695, Final Office Action mailed Dec. 31, 2009.

* cited by examiner

SEQUENTIAL DEPOSITION/ANNEAL FILM DENSIFICATION METHOD

CROSS-REFERENCE TO RELATED APPLICATIONS

This application is a continuation-in-part of U.S. patent application Ser. No. 10/975,028 filed Oct. 26, 2004 now U.S. Pat. No. 7,148,155, titled SEQUENTIAL DEPOSITION/ANNEAL FILM DENSIFICATION METHOD, incorporated herein by reference in its entirety for all purposes.

BACKGROUND OF THE INVENTION

The present invention relates to the formation of dielectric films, in particular to the formation of dense dielectric films in high aspect ratio features on semiconductor substrates.

It is often necessary in semiconductor processing to fill a high aspect ratio gap with insulating material. One example of a high aspect ratio trench encountered in semi-conductor processing is in the formation of shallow trench isolation (STI). As device dimensions shrink and thermal budgets are reduced, void-free filling of high aspect ratio spaces (AR>3.0:1) becomes increasingly difficult due to limitations of existing deposition processes. The deposition of doped or undoped silicon dioxide assisted by high density plasma CVD, a directional (bottom-up) CVD process, is the method currently used for high aspect ratio (AR) gap-fill. Evolving semiconductor device designs and dramatically reduced feature sizes have resulted in several applications where HDP processes are challenged in filling the high aspect ratio structures (AR>7:1) using existing technology (see, for example, U.S. Pat. No. 6,030,881). For structures representative of the 65 nm and 45 nm technology nodes, engineering the gap-fill process becomes structure dependent, hence the process needs to be reoptimized, a task of considerable complexity, every time a new structure needs to be filled.

An alternative to CVD is atomic layer deposition (ALD). ALD methods involve self-limiting adsorption of reactant gases and can provide thin, conformal dielectric films within high aspect ratio features. An ALD-based dielectric deposition technique typically involves adsorbing a metal containing precursor onto the substrate surface, then, in a second procedure, introducing a silicon oxide precursor gas. The silicon oxide precursor gas reacts with the adsorbed metal precursor to form a thin film of metal-doped silicon oxide. One drawback, however, to ALD is that the deposition rates are very low. Films produced by ALD are also very thin (i.e., about one monolayer); therefore, numerous ALD cycles must be repeated to adequately fill a gap feature. These processes are unacceptably slow in some applications in the manufacturing environment.

A related technique, referred to as rapid vapor deposition (RVD) or pulsed deposition layer (PDL) processing, is another alternative. RVD is similar to ALD in that reactant gases are introduced alternately over the substrate surface, but in RVD the silicon oxide film can grow more thickly. Thus, RVD methods allow for rapid film growth similar to using CVD methods but with the film conformality of ALD methods. An example of the process is described in the paper by Hausmann et. al. entitled Rapid Vapor Deposition of Highly Conformal Silica Nanolaminates (2002, Science, 298, pages 403-406).

Deposited oxide films require densification in order for its properties to match those of thermally generated silicon oxide (USG, which will allow its successful integration into functioning devices. Densification removes water from the deposited film. Moreover, the conformal nature of the process results in the formation of seams in filled trenches, which may allow attack by post gap fill wet etch (HF-based) in the seam. Etching in the seam can allow for polysilicon deposition in the seam during subsequent processing which would obviate its insulating effect. Therefore, a process sequence to anneal the film and substantially eliminate seams and voids is required.

Optimally, this process sequence can operate at under 500° C., in order to be able to meet the thermal budget requirements of advanced devices (see A. R. Londergan, et. al., J. Electrochem. Soc., vol. 148, pp. C21-C27, January 2001). In premetal dielectric (PMD) applications, for example, where a layer of silica is applied over gates that have been previously built-up on a substrate, there is an inherent temperature limitation due to the material used to construct the gates, usually a metal silicide such as a nickel silicide. At temperatures above about 400-500° C., the gate silicide may become discontinuous, thereby increasing the resistance of the circuit and leading to performance problems. Further, there may be two or three PMD layers applied to a substrate before application of metal conductors. Thus, it is desirable to implement a method to improve the material properties of the dielectric film, ideally maintaining temperatures that are low enough to avoid damaging underlying heat sensitive structures.

SUMMARY OF THE INVENTION

The present invention addresses this need by providing a multi-step method of forming a densified silicon oxide-based dielectric film. First, a thin layer of silicon oxide-based dielectric is thermally deposited. Then, the dielectric film is densified by an annealing process that removes water from the deposited layer. The deposition and anneal steps are then repeated until the desired dielectric film thickness is obtained. The technique enables dielectric gap fill to the 45 nm technology node and beyond, while maintaining film properties. It accomplishes the densification of the thermally deposited oxide films without the need for high temperature anneal in structures as deep as 1 um.

The dielectric deposition may be by any suitable process, for example CVD, SOG (spin-on glass), or RVD. The dielectric may be any suitable silicon oxide-based material, doped or undoped, for example undoped silicon dioxide (undoped silica glass (USG)). The deposited dielectric layers should be thin enough that they are substantially completely penetrated by the annealing process agent (e.g., Oxygen-based plasma, heat, radiation or associated active chemical species) and that the water ($H_2O$) generated during annealing can migrate out of the layer. In this manner, efficient removal of $H_2O$ from the film is facilitated, since the diffusion length for $H_2O$ is reduced relative to conventional thicker film depositions. In general, a layer thickness of about 300-3000 Å or 500-1500 Å, for example about 1000 Å is suitable.

Annealing may be accomplished by a number of different techniques, including thermal, plasma and radiation based processes. A preferred annealing process is high density plasma (HDP)-based. A high density plasma in an oxidizing environment can densify thin dielectric films at low temperatures. Thus, this technique has the advantage of annealing while staying within the thermal budget constraints of temperature sensitive dielectric formation applications, e.g., PMD.

In one embodiment, silica nanolaminates formed in a high aspect ratio feature by rapid vapor deposition (RVD) are annealed in a HDP reactor in order to densify the layers and eliminate seams and voids, which are caused by the conformal nature of RVD. This method involves the following principle operations: 1) exposing a substrate surface to a catalytic metal-containing precursor gas to form a substantially saturated layer of catalytic metal-containing precursor on the substrate surface, 2) exposing the substrate surface to a silicon-containing precursor gas to form a thin dielectric layer on the substrate surface, 3) annealing the thin layer at a temperature below 500° C. using HDP under oxidizing conditions; and 4) repeating 1) to 3) until a desired dielectric film thickness is achieved, e.g., until the gap is filled. The $O_2$ based HDP reactive plasma results in film densification and cross-linking at temperatures of less than 500° C. Low temperature operation is enabled by the high concentration of reactive species in the high density plasma. The film expands as a result of Si—O bond formation during annealing, eliminating seams in the film, a critical element for its successful integration. Optimizing film properties at low temperature allows for the use of the film low thermal budget PMD applications.

The method of the invention can be used for forming a dielectric film for any purpose. In a specific embodiment, it is used for filling structures, such as gaps, in particular high aspect ratio trenches, on semiconductor substrates, e.g., IMD, PMD and STI applications.

Various RVD process precursors may be used in preferred embodiments of the invention. For example, a catalytic metal-containing precursor can be an aluminum-containing precursor, such as hexakis(dimethylamino) aluminum or trimethyl aluminum. The formation of silica films by RVD can also alternatively be catalyzed by metal and metalloid-free compounds, such as acidic compounds, for example phosphoric acid ($H_3PO_4$).

The silicon containing precursor can be a silanol, such as tris(tert-butoxy)silanol (($C_4H_9O)_3SiOH$) or tris(tert-pentoxy)silanol (($C_5H_{11}O)_3SiOH$), or a silanediol, such as di(tert-butoxy)silandiol. Preferred flow rates for the silicon-containing precursor range between about 20 to 1000 sccm.

The resulting dielectric film has improved properties after annealing. For example, the dielectric film may have a k-value of between about 3.8-4.3, a film stress of between about 2 Gdyn/cm$^2$ tensile and 2 Gdyn/cm$^2$ compressive, and a wet etch rate ratio (WERR) of less than 1.3:1 relative to conventionally formed thermal oxide.

Exposure to the aluminum-containing precursor and the silicon-containing precursor may occur in the same chamber or different chambers in preferred embodiments of the invention. Further, additional precursor gases may be used.

These and other aspects and advantages of the present invention are described below.

DETAILED DESCRIPTION OF SPECIFIC EMBODIMENTS

Figure 1A:
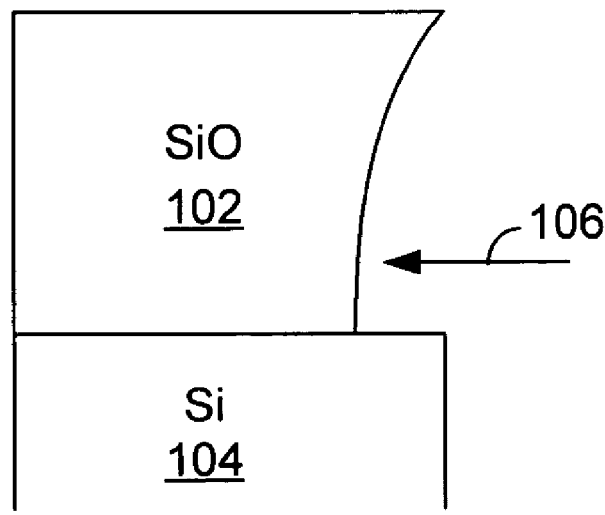
FIGS. 1A-B illustrate the problem of incomplete densification of the film and the improved results obtainable using the present invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

INTRODUCTION

As indicated, the present invention provides a multi-step method of forming a densified silicon oxide-based dielectric film. First, a thin layer of silicon oxide-based dielectric is thermally deposited. Then, the dielectric film is densified by an annealing process that removes water from the deposited layer. The deposition and anneal steps are then repeated until the desired dielectric film thickness is obtained. The technique enables dielectric gap fill to the 45 nm technology node and beyond, while maintaining film properties. It accomplishes the densification of the thermally deposited oxide films without the need for high temperature anneal in structures as deep as 1 um.

General Process Parameters

The dielectric deposition may be by any suitable thermal process, for example CVD or RVD. The dielectric may be any suitable silicon oxide-based material, doped or undoped, for example undoped silicon dioxide (undoped silica glass (USG)). The deposited dielectric layers should be thin enough that they are substantially completely penetrated by the annealing process agent (e.g., oxygen-based plasma, heat, radiation or associated active chemical species) and that the water ($H_2O$) generated during annealing can migrate out of the layer. In this manner, efficient removal of $H_2O$ from the film is facilitated, since the diffusion length for $H_2O$ is reduced relative to conventional thicker film depositions. In general, a layer thickness of about 20-20,000 Å or 100-5000 Å is suitable.

As described further below, annealing may be accomplished by a number of different techniques, including thermal, plasma and radiation based processes. Specific examples of suitable annealing processes include thermal, furnace based; (rapid thermal processing (RTP) or rapid thermal oxidation (RTO) based; high density plasma based; capacitive (PECVD) plasma based; laser ablation based; UV film cure based; IR film cure based; and microwave plasma based. One suitable annealing process is high density plasma (HDP)-based. A high density plasma in an oxidizing environment can fully and uniformly densify thin dielectric films at low temperatures. Alternative anneal processes can be thermal based, carried out in a furnace with an oxidizing environment, or incorporate a radiation anneal (UV for example). These techniques have the advantage of annealing while staying within the thermal budget constraints of temperature sensitive dielectric formation applications, e.g., PMD.

The anneal process is rate limited by the diffusion of $H_2O$ through the film. Therefore, thicker films (e.g., greater than 500 nm thick) or films deposited in the deep trenches, which are encountered in STI and PMD applications, cannot be densified to a sufficient level in a single anneal step. FIGS. 1A and B illustrate this problem of incomplete densification of the film and the improved results obtainable using the present invention.

FIG. 1A shows a thick oxide film 102, e.g., greater than 3000 Å of RVD silicon dioxide, deposited on a silicon substrate 104 in a single step following annealing with an HDP plasma in a single step. Since $H_2O$ removal during the anneal process is diffusion limited, it is easier for water to diffuse from the top of the film than the bottom. Wet etch rate ratio (WERR) data collected for such films shows a variable film density, decreasing as a function of depth. As a result, when the film is etched (the etch direction is shown by arrow 106), the amount of film etched is not uniform across the thickness of the film; the amount etched at the top, densified portion, of the film is less than the amount etched at the bottom. Non-uniformity of the etch causes overhang features which contribute to problems including the formation of voids during high aspect ratio gap fill.

Figure 1B:
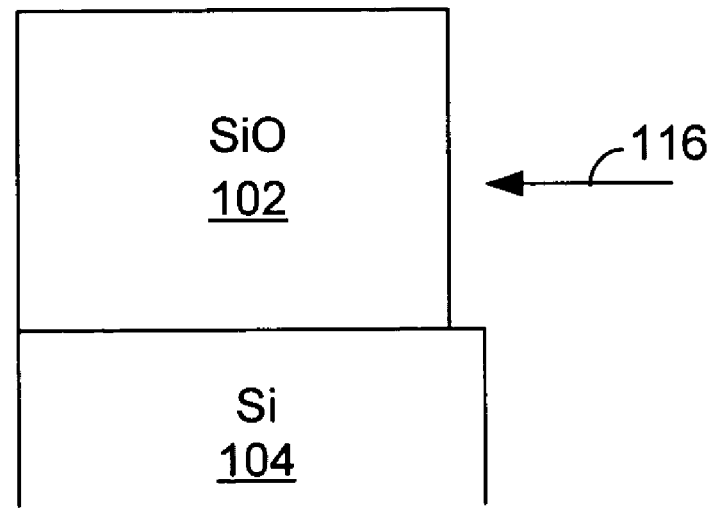

FIG. 1B shows an oxide film 112 of the same thickness as 102 (FIG. 1A), e.g., greater than 3000 Å of RVD silicon dioxide, on a silicon substrate 114. However, in this case, the film is deposited and annealed by the multi-step technique of the present invention in which thin (e.g. 1000 Å) oxide layers are deposited and annealed in series to build up the total desired film thickness. In this way, the annealing process agent (e.g., oxygen-based plasma, heat, radiation or associated active chemical species) is able to fully penetrate the layer and water is able to diffuse through the entire film thickness. As a result, when the film is etched (the etch direction is shown by arrow 116), the amount of film etched is uniform across the thickness of the film.

In one embodiment where the dielectric deposition is used to fill gaps, the gap is partially filled with a layer of oxide; then the oxide layer is annealed to densify the oxide layer. These steps are repeated until the gap is filled with a significantly densified oxide film.

The post-deposition annealing treatment step can be carried out in situ in the deposition chamber, in an integrated mode (tool), or in a separate chamber (with vacuum break). It can be carried out in an oxidizing or inert ambient (e.g., $N_2$) environment. For example, the use of water vapor as an ambient gas for the post-deposition anneal processing of oxide-based film is a known technique.

The anneal step is followed by a second deposition step and the cycle is repeated until the desired densified film thickness is achieved, e.g., the structure is fully filled and densified.

Figure 2:
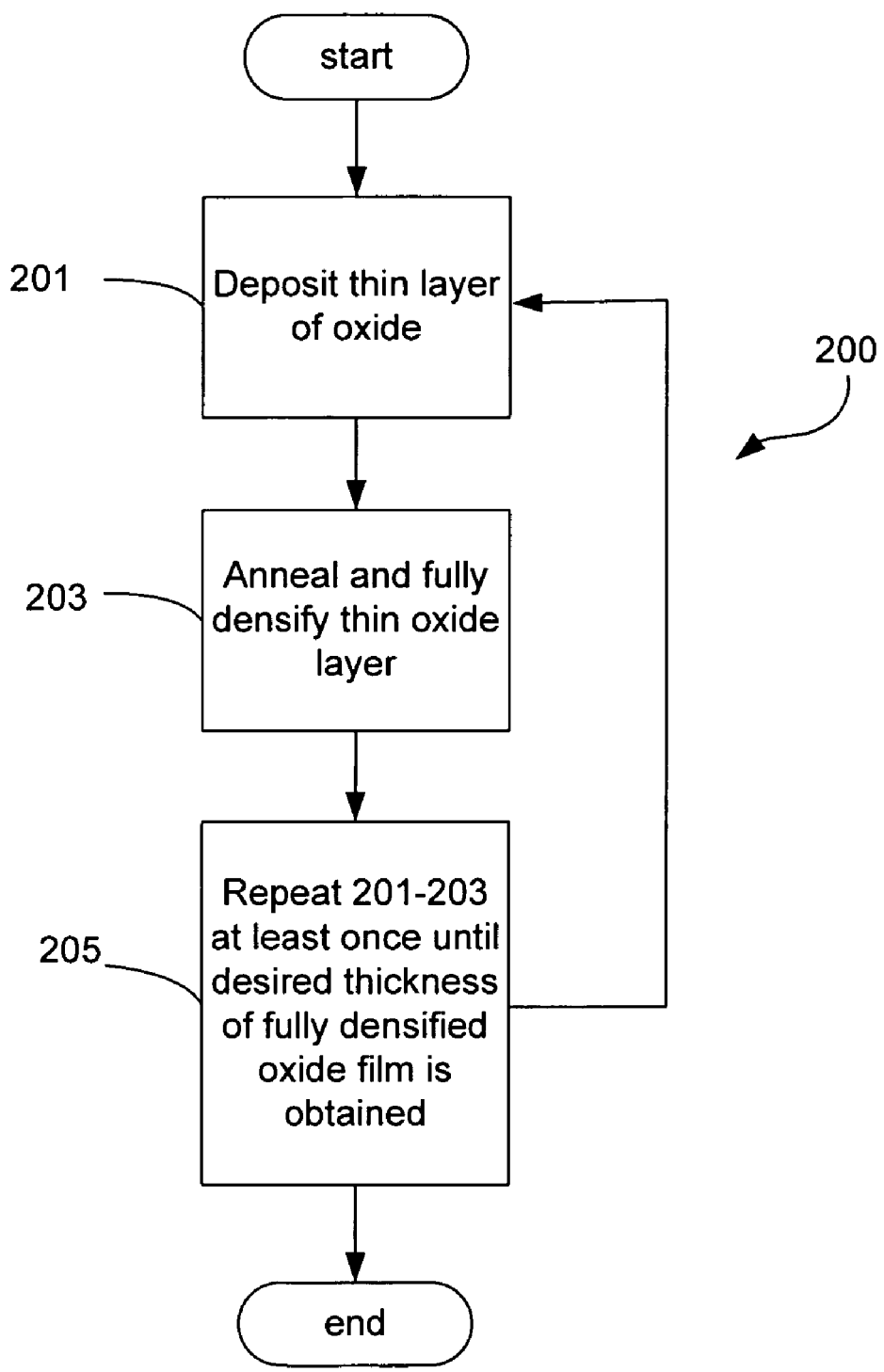
FIG. 2 is a process flow diagram illustrating relevant operations of a multi-step sequential deposition/anneal process to form a fully densified dielectric film in accordance with the present invention.

The foregoing process is summarized in FIG. 2 which provides a flow illustration of a process in accordance with the present invention. A thin oxide layer is deposited on a substrate, for example by exposing the substrate surface to a silicon-containing precursor gas to form a silicon oxide-based dielectric film layer on the substrate (201). If the dielectric is deposited over a substrate feature such as a gap, the thin layer only partially fills the gap. In general, the layer is sufficiently thin to not prevent substantially complete penetration of the annealing agent into the layer and migration of water out of the layer. The thin layer is then annealed to remove water (203), and the deposition and anneal steps are repeated at least once to form a densified dielectric film of a desired thickness, e.g., a film that fills a gap (205).

Figure 3A:
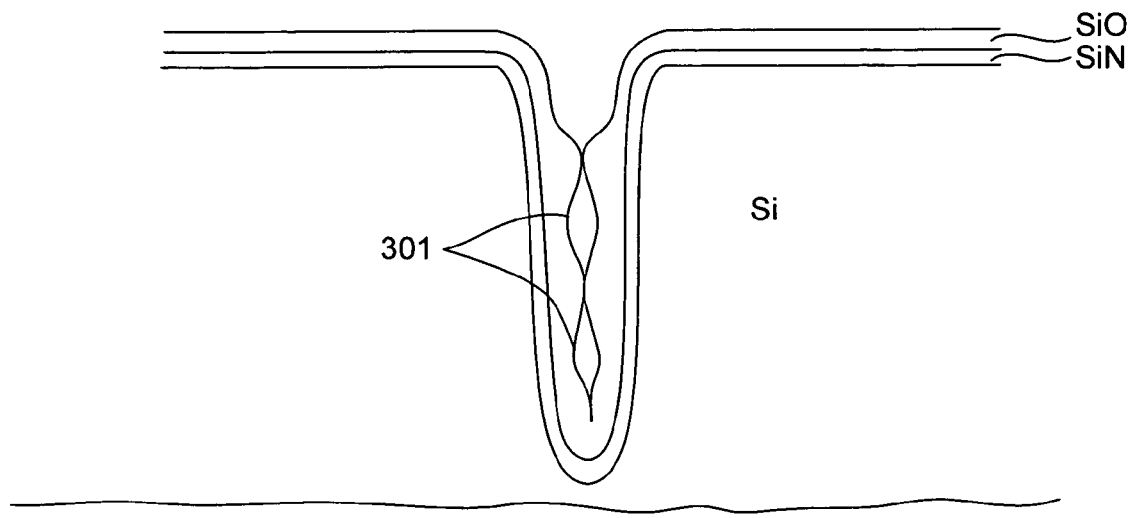
FIGS. 3A-B illustrate the relative improvement in performance achieved by the method of the present invention in a gap fill application.
Figure 3B:
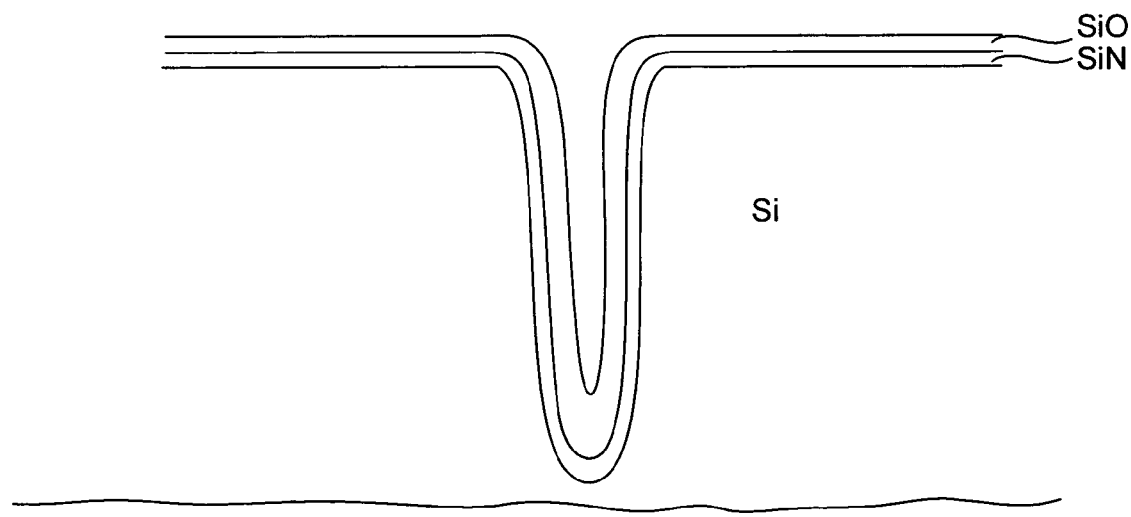

The relative improvement in performance achieved by the method of the present invention in a gap fill application is illustrated in FIGS. 3A and B. FIG. 3A represents a single step RVD oxide deposition and anneal process. Decoration of such a sample (e.g., by 6:1 BOE for 10 sec) dissolves low density (only partially densified) oxide material and creates voids 301 in the trench. FIG. 3B represents a multi-step process in accordance with the invention, each cycle a RVD thin oxide deposition followed by anneal. Since the film is fully densified, no material is dissolved by decoration of such a sample in the same way. Hence, the film's performance is improved. For example in post-STI processing (such as wet dips) the film will be better at preventing any void or open seam formation.

RVD/HDP Embodiment

A preferred annealing process is high density plasma (HDP)-based. A high density plasma in an oxidizing environment can fully and uniformly densify thin dielectric films at low temperatures. This technique has the advantage of annealing while staying within the thermal budget constraints of temperature sensitive dielectric formation applications, e.g., PMD.

Generally, a RVD method involves sequentially depositing a plurality of atomic-scale films on a substrate surface by sequentially exposing and removing reactants to and from the substrate surface. An exemplary case of RVD using reactant gases A and B will now be used to illustrate principle operations of a RVD process in accordance with the present invention. First, gas A is injected into a chamber and the molecules of gas A are chemically or physically adsorbed to the surface of a substrate, thereby forming a "saturated layer" of A. Formation of a saturated layer is self-limiting in nature and represents a thermodynamically distinct state of adsorbed A on a surface. In some cases, a saturated layer is only one monolayer. In other cases, a saturated layer is a fraction of a monolayer, or some multiple of monolayers.

After a saturated layer of A is formed, typically, the remaining gas A in the chamber is purged using an inert gas. Thereafter, the gas B is injected so that it comes in contact with the adsorbed layer of A and reacts to form a reaction product of A and B. Because the saturated layer of A is nominally thin and evenly distributed over the substrate surface, excellent film step coverage can be obtained. B is flowed over the substrate for a period of time sufficient to allow the reaction between A and B to preferably go to completion; i.e., all of the adsorbed A is consumed in the reaction. In a RVD process, B is flowed over the substrate for a period of time sufficient for B to accumulate to thicknesses in excess of one monolayer. After a desired film thickness is achieved, the flow of B is stopped and the reaction is halted. At this point, residual gas B and any byproducts of the reaction are purged from the chamber. Further RVD cycles of substrate exposure to A, followed by exposure to B, can be implemented and repeated as needed for multiple layers of material to be deposited.

RVD methods are related to the well-established chemical vapor deposition (CVD) techniques; both are thermal deposition techniques. However, in CVD, the chemical reactant gases are simultaneously introduced in a reaction chamber and allowed to mix and chemically react with each other in gas phase. The products of the mixed gases are then deposited on the substrate surface. Thus, RVD methods differ from CVD since in RVD the chemical reactant gases are individually injected into a reaction chamber and not allowed to mix prior to contacting the substrate surface. That is, RVD is based on separated surface-controlled reactions. Either RVD, CVD, or spin-on glass deposition may be used for film deposition in accordance with the present invention.

Figure 4:
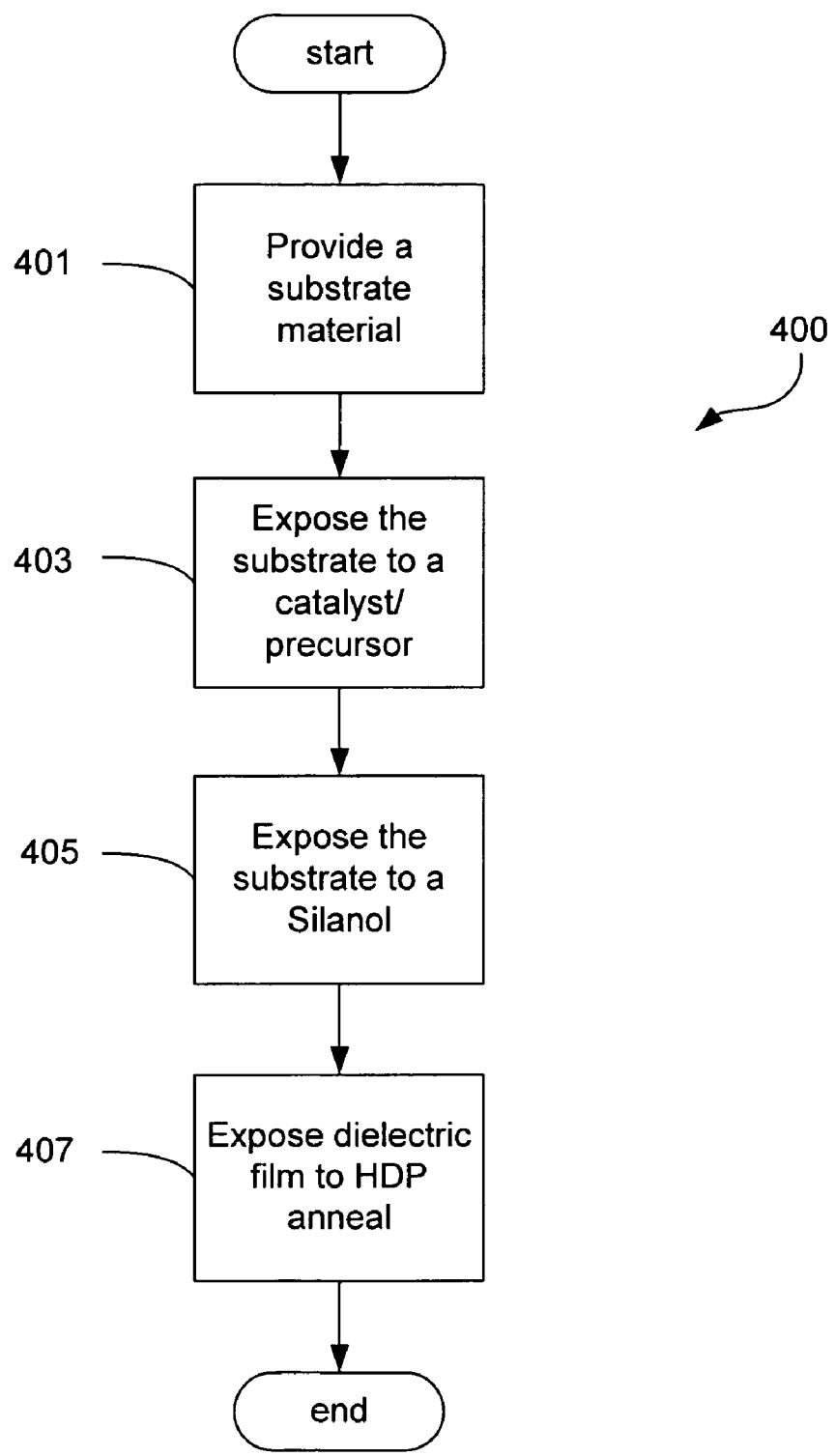
FIG. 4 a process flow diagram illustrating relevant operations employing rapid vapor deposition (RVD) plus HDP/$O_2$ anneal to form a fully densified dielectric film in accordance with the present invention.

FIG. 4 is a process flow diagram illustrating relevant operations in a multi-step rapid vapor deposition (RVD) and high-density plasma (HDP) anneal process to form a fully densified dielectric film in accordance with one embodiment of the present invention.

The deposition process 400 begins with operation 401, wherein a substrate is placed into a deposition chamber. For many embodiments of the invention, the substrate is a semiconductor wafer. A "semiconductor wafer" as discussed in this document is a semiconductor substrate at any of the various states of manufacture/fabrication in the production of integrated circuits. As mentioned previously, two commercially important applications of the present invention are pre-metal dielectric (PMD) and shallow trench isolation (STI).

Next, in operations 403-405, an RVD process is used to deposit a dielectric layer on the substrate. For an example of a suitable RVD process, see U.S. patent application Ser. No. 10/672,309, titled "Properties of a Silica Thin Film Produced by a Rapid Vapor Deposition [RVD] Process", filed on Sep. 26, 2003, which is incorporated by reference herein for all purposes. In operation 403, a catalyst or catalyst-containing precursor gas is pumped into the deposition chamber so as to substantially saturate the surface with the catalyst or catalyst-containing precursor.

Any suitable catalyst or catalyst-containing precursor that can sufficiently adsorb onto the substrate surface and sufficiently react with the subsequently added silicon-containing precursor to form a dielectric layer that is more than a monolayer thick may be used. In addition, the catalyst or catalyst-containing precursor should be capable of aiding the catalytic polymerization of the subsequently added silicon-containing precursor to produce a film thicker than a monolayer. In preferred embodiments, an aluminum-containing precursor, for example, hexakis(dimethylamino)aluminum ($Al_2(N(CH_3)_2)_6$) or trimethylaluminum ($Al(CH_3)_3$) is used. Other suitable aluminum-containing precursors include, for example, triethylaluminum ($Al(CH_2CH_3)_3$) or aluminum trichloride ($AlCl_3$). Other metal-containing precursors that can be deposited to reactivate the catalytic surface include, but are not limited to, zirconium, hafnium, gallium, titanium, niobium, tantalum, and their oxides or nitrides, or combinations thereof.

As indicated earlier, forming a saturated layer is a self-limiting process and to a certain extent independent of process conditions. Relevant process conditions can include pressure, precursor flow rate, substrate temperature, and dose. For a metal catalyst-containing precursor, pressures can range broadly, e.g., between about 1 mTorr and 760 Torr. Typical pressures range between about 10 mTorr and 5 Torr and typical temperatures range between about 20 and 300 degrees Celsius. Flow rates of aluminum-containing precursor gas, for example, can range broadly, e.g., between about 1 and 10000 sccm. Preferred flow rates of aluminum-containing precursor gas range between about 10 and 1000 sccm. The dose of aluminum-containing precursor, for example, can range broadly, e.g., between about 0.001 milligrams and 10 grams. Typical aluminum-containing precursor doses range between about 0.01 and 0.1 grams. Exposure times suitable for forming a saturated layer are typically only seconds. In some embodiments, for example, an exposure time of about 1 to 2 seconds is found to be sufficient.

The formation of silica films by a RVD can also alternatively be catalyzed by metal and metalloid-free compounds, such as acidic compounds, for example phosphoric acid ($H_3PO_4$). Metal- and metalloid-free compounds suitable as catalysts in a RVD process include organic acids (e.g., acetic acid), anhydrides of organic acids, dialkylphosphates, alkysphosphates, phosphonic acids, phosphinic acids, phosphorus oxides, alkylamines (primary, secondary or tertiary), arylamines, alky/arylboronic acids, sulphonic acids, water, ammonium salts, phosphonitrile compounds, boron triflates, inorganic acids (e.g., phosphoric acid), anhydrides of inorganic acids, and combinations thereof.

For a metal- and metalloid-free catalyst, pressures can range broadly, e.g., between about 1 mTorr and 760 Torr. Typical pressures range between about 500 and 1250 mTorr and typical temperatures range between about 0 and 300° C., for example between about 20 and 250° C., such as 20, 50, 100, 200, 230 or 250° C. in various implementations. Flow rates of catalyst reactants can range broadly, e.g., between about 1 and 10000 sccm in the gas phase. Preferred gas phase flow rates of the catalyst range between about 1 and 1000 sccm. Catalysts may also alternatively be delivered to the reactor and/or the substrate surface in the liquid phase. Suitable liquid phase delivery flow rates can be between 0.01 and 100 mL/min; or the liquid catalysts can be delivered to the substrate surface by dipping, painting, spraying, etc. Suitable liquid phase catalyst concentrations can vary widely, for example from about $10^{-3}$ to 12M, such as about 0.01, 0.1, 1, 2, 5, 7 or 10M. Exposure times suitable for forming a saturated layer are typically only seconds, e.g., about 0.1 to 10 seconds. In some embodiments, for example, an exposure time of about 1 seconds or 5 seconds is found to be sufficient. Given the directions and parameters provided herein, one of skill in the art will be able to readily determine the appropriate conditions for effective use of a given catalyst in accordance with the present invention.

After the catalyst layer is formed an inert gas is preferably used to purge the substrate surface and reaction chamber (not shown). It should be noted that introduction of a purge gas can be used in between operations wherein contact between reactant gases should be avoided, including between each process cycle. Further, the purge gas can be flowed continuously during any of these operations and a period or periods between the operations. Purge gases are generally inert. Examples include the noble gases (e.g., argon) and nitrogen. The reaction chamber may additionally be evacuated following inert gas purge.

Next, after the chamber is purged, process 400 continues with the exposure of the catalyst-activated substrate surface to a silicon-containing precursor gas under conditions suitable for the growth of a dielectric film in operation 405. Any suitable silicon-containing precursor that can sufficiently adsorb onto and react with the saturated layer of aluminum-containing precursor to form a dielectric film may be used. In addition, the silicon-containing precursor should be capable of polymerization when exposed to the adsorbed catalyst to produce a film thicker than a monolayer. Preferred silicon-containing precursors include silanols and silanediols, such as alkoxysilanols, alkyl alkoxysilanols, alkyl alkoxysilanediols and alkoxysilanediols. Examples of suitable precursors include tris(tert-butoxy)silanol (($C_4H_9O)_3SiOH$), tris (tert-pentoxy)silanol(($C_5H_{11}O)_3SiOH$), di(tert-butoxy) silandiol (($C_4H_9O)_2Si(OH)_2$) and methyl di(tert-pentoxy) silanol.

While the invention is not limited to this theory of operation, as mentioned previously, it is believed that the catalyst is adsorbed onto or reacts with the substrate surface, and the accumulation of dielectric film is achieved via a polymerization process. The activated substrate surface layer can catalytically polymerize the silicon-containing precursor to produce growing chains of silica. After a period of growth determined by the substrate temperature, the silica polymer can "gel" or "cross-link" to form a solid silicon dioxide. The final film thickness depends on the silicon dioxide layer formation rate and the amount of time the silicon containing precursor is exposed to the activated substrate surface layer. The film can also be made thicker by repeating the number of precursor deposition cycles.

Process parameters during exposure to the silicon-containing precursor including temperature, gas pressure, flow rate, dose and exposure times will vary depending on the types of precursors used, reaction chamber configuration and desired final film thickness, deposition rate and dielectric characteristics, among other variables. Temperatures can range from about 20 to 300° C. A typical deposition temperature is about 20-250° C. Pressures can range broadly, e.g., between about 1 mTorr and 760 Ton. Typical pressures range between about 10 mTorr and 750 5 Ton. Flow rates of silicon-containing precursor gas can range broadly, e.g., between about 1 and 10000 sccm. Preferred flow rates of silicon-containing precursor gas range between about 10 and 1000 sccm. The dose of silicon-containing precursor can range broadly, e.g., between about 0.001 milligrams and 100 grams. Typical silicon-containing precursor doses range between about 0.1 and 2 grams. Exposure times can range broadly, e.g., between about 1 milliseconds and 1000 seconds. Preferred exposure times typically range between about 1 and 100 seconds.

The deposited dielectric layer should be thin enough that it can be substantially completely penetrated by the annealing process agent (e.g., Oxygen-based plasma, heat, radiation or associated active chemical species) in the subsequent annealing process and that the water ($H_2O$) generated during annealing can migrate out of the layer. In general, a layer thickness of about 20-20000 A, for example about 100-5000 Å is suitable. This layer may be generated in one or more depositions as described above; i.e., the RVD dielectric deposition operations 403-405 may be conducted once or repeated multiple times to form the layer.

Returning to FIG. 4, after a thin dielectric layer has been formed, an anneal operation 407 using a low temperature oxygen-containing inductively coupled high density plasma (HDP) is performed in order to improve the mechanical properties of the film. The HDP anneal is used to remove water from the as-deposited film. In the present invention, HDP operation 407 is performed in an oxidizing environment. Specifically, the oxidizer used is an oxygen-containing oxidizer such as $O_2$, $H_2O$, $H_2O_2$, air, or $O_3$. One advantage of using an oxygen-containing oxidizer is that the oxygen in the plasma reacts with the RVD deposited film to cross-link silica and reduce or eliminate seams created during RVD gap fills. At the same time, the oxygen substitutes for the water that is removed from the film in the anneal process so that the film does not shrink and the film stress is not increased by water removal. Note that it is important to eliminate the seam in gap fill (STI, for example) by annealing to prevent attack by post gap fill wet etch (HF-based) in the seam. Etching in the seam can allow for polysilicon deposition in the seam in subsequent processing which would obviate its insulating effect.

Suitable temperatures range from about 250° C. to 750° C.; suitable pressures range from about 1 to 1000 mTorr; and suitable time ranges from about 30 sec to 20 min. In one embodiment of the invention, the annealing operation lasts from between about 330 to 700 seconds. In a second embodiment, the annealing operation lasts about 600 seconds.

Operations 403-407 are repeated as necessary until a desired thickness of dielectric material has been reached, e.g., a gap has been filled.

The resulting dielectric film has improved properties after annealing. For example, the dielectric film may have a k-value of between about 3.8-4.0, a film stress of between about 2 Gdyn/cm$^2$ tensile and 2 Gdyn/cm$^2$ compressive, and a wet etch rate ratio (WERR) of less than 1.3:1 relative to conventionally formed thermal oxide.

Other Embodiments

This method applies to the deposition of silica (USG). However, this method may also be used for depositing doped silica films, such as fluorine-doped silicate glass (FSG), phosphosilicate glass (PSG), boro-phospho-silicate glass (BPSG), or carbon doped low-k materials.

Other deposition co-reactants, such as silanols with varying substituents (i.e., more than one kind of alkoxy substituent) may be used to improve the film characteristics. For an example, see U.S. patent application Ser. No. 10/874,814, filed Jun. 22, 2004, titled "Mixed Alkoxy Precursors and Methods of Their Use for Rapid Vapor Deposition of SiO$_2$ Films." Furthermore, the properties of the dielectric film may be improved by other means as well, including by using an aluminum oxide nucleation layer formed by ALD prior to the application of the silica layer. See, for example, U.S. patent application Ser. No. 10/875,158, filed Jun. 22, 2004, titled "Silica Thin Films Produced By Rapid Surface Catalyzed Vapor Deposition (RVD) Using a Nucleation Layer." Note also that this technique may be used in combination with a phosphorous getterer as described in U.S. patent application Ser. No. 10/874,808, filed Jun. 22, 2004, titled "Aluminum Phosphate Incorporation In Silica Thin Films Produced By Rapid Surface Catalyzed Vapor Deposition (RVD)." The above-referenced applications are incorporated by reference in their entirety for all purposes.

The method is primarily described above with reference to a RVD-based embodiment, however it is also applicable to any deposition technique that forms films requiring densification, in particular CVD films.

Also, as noted above, annealing may be accomplished by a number of different techniques other than the HDP/O$_2$ anneal exemplified above, including those described below:

Thermal, furnace based: For example, furnace anneal at a temperature of greater than 700° C. for at least 30 minutes.

Rapid thermal anneal (RTA) or rapid thermal oxidation (RTO) based: For example, anneal at a temperature of greater than 600° C. for at least 5 minutes in either inert (e.g., N$_2$) or oxidizing (e.g., 70% N$_2$, 30% steam) environments, respectively).

Capacitive (PECVD) plasma based: For example, anneal at a source power (HF) of at least 5000 W at a temperature of about 400° C. for at least 10 minutes.

Microwave plasma based: For example, anneal at a temperature of about 200 to 400° C., a pressure of about 1 to 100 Torr, an oxygen-containing gas flow of about 2 L/min, and a power of up to 10,000 W, for at least 3 minutes.

Laser based: For example, application of a localized energy pulse, such as a laser pulse, for example one of about 10 to 100 ns in duration from an excimer laser, that raises the temperature of the film above 1000° C. without raising the substrate temperature sufficiently to modify its properties (e.g., the substrate temperature remains below 550° C. or preferably in many applications below 400° C.). Such a localized energy pulse technique, as described in further detail in commonly assigned co-pending application Ser. No. 11/327,668, incorporated herein by reference, can raise the temperature the film sufficiently to melt the film and/or remove hydroxyl moieties from the film.

UV cure based: For example, anneal at a power density of less than 5 W/cm$^2$, in either inert (e.g., He, Ar, forming gas, or N$_2$) or oxidizing environments (e.g., in an anneal environment that comprises one or more of oxygen, ozone, peroxide or nitrous oxide) In oxidizing environments, oxygen can promote bond breaking thereby facilitating hydrogen removal for film densification. The UV source can be a single wavelength excimer lamp or broad spectra source with arc or microwave excitations. The wavelength can be from about 100 nm-1000 nm, preferably from about 150-500 nm. The process pressure can range from about 1 mTorr to 760 Torr, preferably from about 1 Torr to 200 Ton. The UV exposure can also be achieved through direct exposure to a plasma of He, Ar, N$_2$, NH$_3$, N$_2$O, O$_2$, or a mixture of them. The wafer temperature can be set at from about 25° C. to 700° C., preferably from about 300-700° C.

IR-based cure: For example, anneal in either inert (e.g., He, Ar, or N$_2$) or oxidizing environments with an IR source such as halogen lamps or other IR radiators can be placed directly above the substrate or through an IR-transparent window. The process pressure can range from about 10 mTorr to 760 Ton, and preferably from about 1 Torr to 200 Ton. The wafer temperature can be set at 25 C to 700 C, preferably from 300-700 C.

Electron-beam (E-beam) based: For example, a high-energy electron beam can provide the energy to break —OH bonds and remove H$_2$O from the film. The electron energy can range from about 100 eV to 100 keV, preferably from about 5 keV to 30 keV for curing a film ranging from about 200 Å to 2 microns. The process pressure can range from about 0.001 mTorr to 760 Torr depending on the type of electron source employed. The wafer temperature can be set at about 25° C. to 700° C., preferably from 300-700° C.

Downstream plasma based: In this embodiment, the plasma may comprise an oxygen-containing gas or forming gas (a mixture of hydrogen and nitrogen), for example. The down stream plasma provides the active molecular species to extract —OH from the film, causing effective removal of H$_2$O from the film. The process pressure can range from about 1 mTorr to 100 Torr, preferably from about 0.1 Torr to 10 Torr. The wafer temperature can be set at about 25° C. to 700° C., preferably from about 300-700° C.

In addition, in one embodiment of the invention, a plurality of layers of a multi-laminate dielectric film, up to all, may be deposited prior to an anneal operation, as described, and then annealed in a single anneal operation, so long as the aggregate thickness of the dielectric multi-laminate film or portion thereof formed prior to annealing is insufficient to prevent substantially complete penetration of the annealing agent into the film and migration of water out of the film.

Apparatus

The deposition and post-deposition annealing treatment steps can be carried out in situ in the same chamber, in an integrated mode (tool), or in separate chambers (with vacuum break). Some sample apparatus for implementing the invention are described below. While the apparatus described below relate to RVD and HDP annealing, it should be understood that these are just examples of deposition and annealing techniques suitable for implementation of the present invention. Several other deposition and anneal techniques, noted above, and associated apparatus, examples of which are known in the art, may alternatively be used.

Deposition Apparatus

Figure 5:
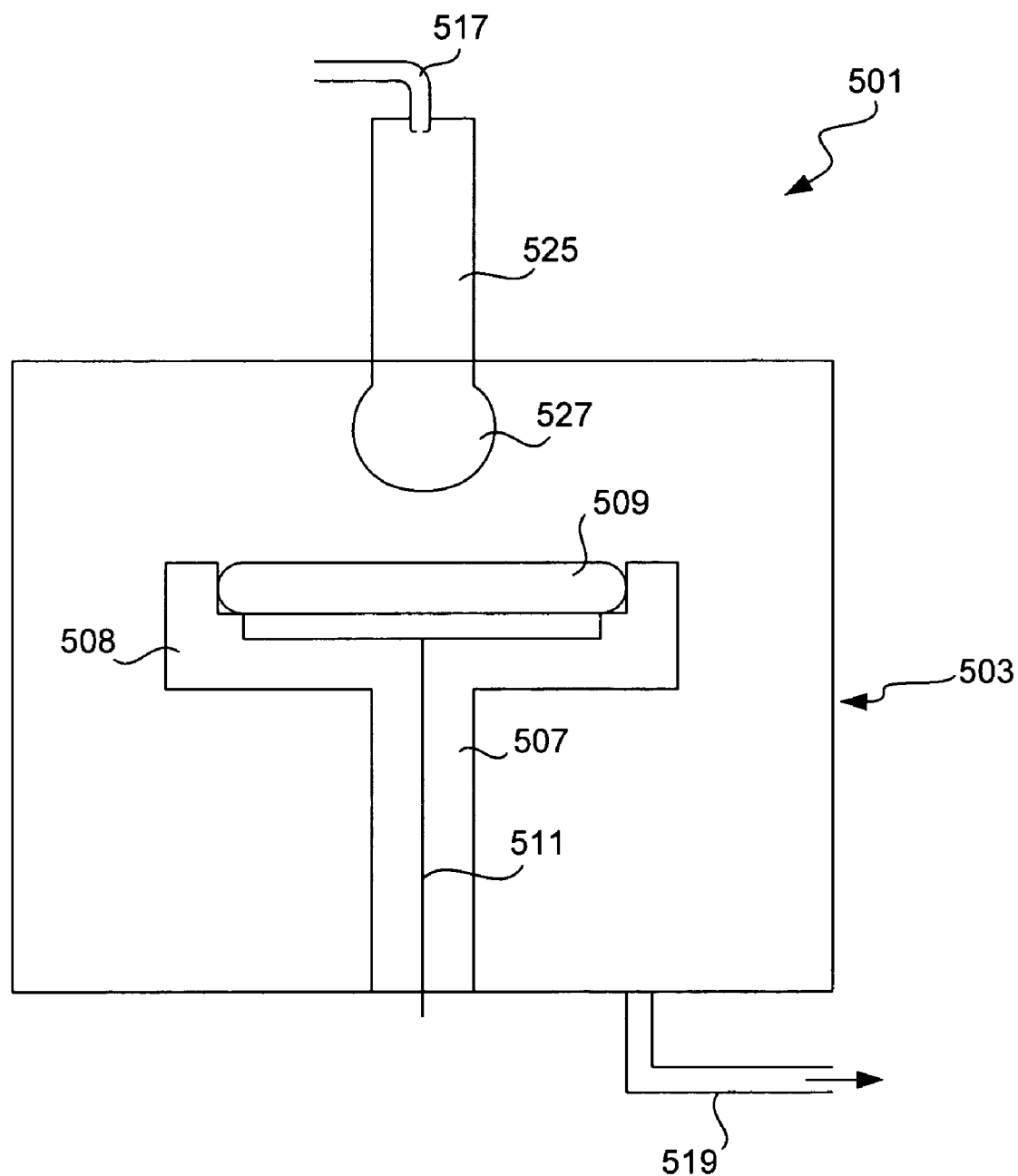
FIG. 5 is a schematic diagram showing the basic features of a RVD reactor module suitable for practicing the current invention.

FIG. 5 is a block diagram depicting some components of a suitable reactor for performing dielectric deposition using a RVD process in accordance with one embodiment of this invention. Note that this apparatus is only an example of suitable apparatus for deposition in accordance with this embodiment of the present invention. Many other apparatuses and systems, including a multi-chambered apparatus, may be used.

As shown, a reactor 501 includes a process chamber 503, which encloses components of the reactor and serves to contain the reactant gases and provide and area to introduce the reactant gases to substrate 509. The chamber walls may be made of or plated with any suitable material, generally a metal that is compatible with the deposition and associated processes conducted therein. In one example, the process chamber walls are made from aluminum. Within the process chamber, a wafer pedestal 507 supports a substrate 509. The pedestal 507 typically includes a chuck 508 to hold the substrate in place during the deposition reaction. The chuck 508 may be an electrostatic chuck, a mechanical chuck or various other types of chuck as are available for use in the industry and/or research.

A heat transfer subsystem including lines 511 for supplying a heat transfer fluid to the pedestal 507 controls the temperature of pedestal 507. In some embodiments, the heat transfer fluid comprises water or another liquid. The reactant gases, as well as inert gases during purge, are introduced individually into the reactor at tube 525 via inlet 517. A showerhead 527 may be used to distribute the gas flow uniformly in the process reactor. Reactant gases are introduced through a gas supply inlet mechanism including orifices. There may be multiple reactant gas tubes and inlets. A vacuum pump) connected to outlet 519 can draw out gases between RVD cycles.

Anneal Apparatus

Figure 6:
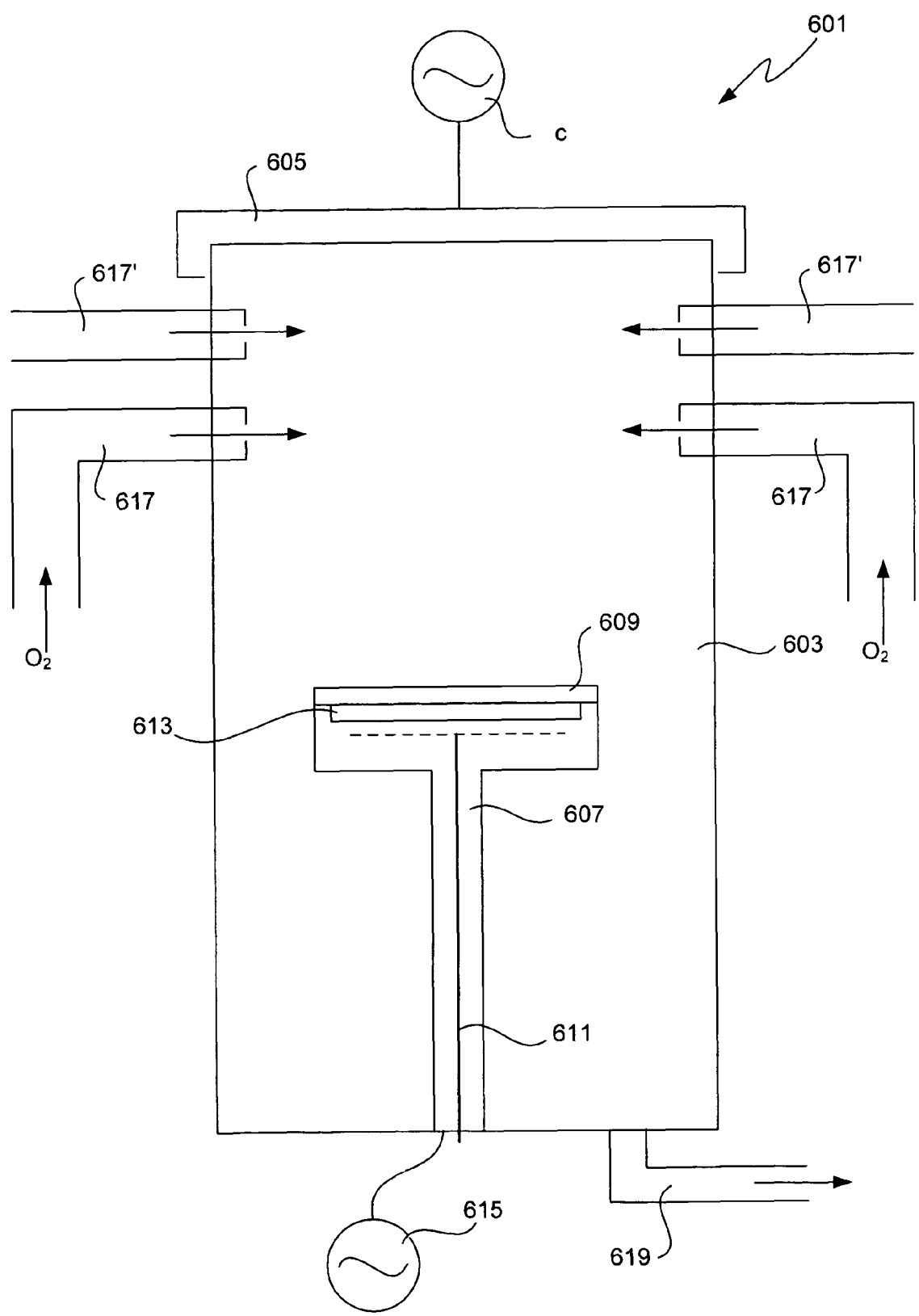
FIG. 6 is a schematic diagram showing the basic features of a HDP reactor module suitable for practicing the current invention.

In accordance with one embodiment of the present invention, post-deposition annealing may be conducted using a HDP-based process. FIG. 6 is a block diagram depicting some components of a suitable HDP reactor for performing HDP/O$_2$ annealing in accordance with one embodiment of this invention. Note that this apparatus is only an example of suitable apparatus for annealing in accordance with this embodiment of the present invention. Many other apparatuses and systems, including a multi-chambered apparatus, may be used.

The principal components of most suitable reactors include a reaction chamber, a process gas delivery system, a support for the substrate, one or more electrodes to generate a plasma and a bias source for the substrate. The particular design is not critical to this invention. It merely needs to support an inductively coupled high-density plasma generated by the appropriate gases over the appropriate substrates. Examples of suitable reactors include the Novellus SPEED reactor, available from Novellus Systems, Inc. of San Jose, Calif., and the Ultima reactor, available from Applied Materials, Inc. of Santa Clara, Calif.

Referring to FIG. 6, a simple block diagram depicting various HDP reactor components arranged as in a conventional reactor is provided. As shown, a reactor 601 includes a process chamber 603 which encloses other components of the reactor and serves to contain the plasma generated by an electrode 605. In one example, the process chamber walls are made from aluminum, aluminum oxide, and/or other suitable material. Electrode 605 is powered by a "low frequency" RF source 606. The power and frequency supplied by source 606 is sufficient to generate high-density plasma from the process gas.

Within the reactor, a wafer pedestal 607 supports a substrate 609. The pedestal typically includes a chuck to hold the substrate in place during the deposition reaction. The chuck may be an electrostatic chuck, a mechanical chuck or various other types of chuck as are available for use in the industry and/or research.

A heat transfer subsystem including a line 611 for supplying a heat transfer fluid controls the temperature of substrate 609. In some embodiments, the heat transfer fluid comprises at least one of helium and argon gas. The heat transfer fluid is supplied to a space 613 between the surface of the substrate and a surface of the chuck.

A "high frequency" RF source 615 serves to electrically bias substrate 609 and draw charged precursor species onto the substrate for the deposition reaction. Electrical energy from source 615 is coupled to substrate 609 via an electrode or capacitive coupling, for example. Note that the bias applied to the substrate need not be an RF bias. Other frequencies and DC bias may be used as well. In a specific embodiment, source 615 supplies a radio frequency bias to the substrate, and the radio frequency bias is generated by supplying the electrode with about 500 W of power.

The process gases, for example oxidant (e.g., $O_2$), are introduced via one or more inlets 617 and 617'. The gases may be premixed or not. Preferably, the process gas is introduced through a gas supply inlet mechanism including orifices. In some embodiments, at least some of the orifices orient the process gas along an axis of injection intersecting an exposed surface of the substrate at an acute angle. Further, the gases or gas mixtures may be introduced from a primary gas ring, which may or may not direct the gases toward the substrate surface. Injectors may be connected to the primary gas ring to direct at least some of the gases or gas mixtures into the chamber and toward substrate. Note that injectors, gas rings or other mechanisms for directing process gas toward the wafer are not critical to this invention. The sonic front caused by a process gas entering the chamber will itself cause the gas to rapidly disperse in all directions—including toward the substrate. Process gases exit chamber 603 via an outlet 619. A vacuum pump (e.g., a turbomolecular pump) typically draws process gases out and maintains a suitably low pressure within the reactor.

Reactor pressure is held at a value necessary to sustain the high-density plasma. Preferably the process vessel is maintained at a pressure of at most about 200 mTorr. In some cases, the process chamber pressure is maintained below 1 mTorr. For many applications, however, the pressure is maintained between about 1 and 1000 mTorr; most preferably between about 1 and 30 mTorr. In one embodiment of the invention, the pressure is maintained at about 2 mTorr during annealing.

Wafer temperature should be maintained sufficiently high to ensure that complete film densification. However, the temperature may be limited by process constraints, such as thermal budget limitations that preclude temperatures above 500° C. Such constraints become increasingly common with advanced technologies and corresponding smaller feature sizes. For such applications, the anneal temperature is preferably maintained between about 300 and 500° C. The low frequency power applied to the upper electrode (for generating the plasma) typically varies from 1 kW to 20 kW, and the high frequency power (for biasing the wafer) typically reaches at least about 0.1 W/cm², for example 1 W/cm² (preferably varying from about 0.5 kW to 10 kW) depending on the substrate size (e.g., 200 or 300 mm diameter) and the requirements of the specific process being used.

As indicated above, the bias applied to the substrate is typically a radio frequency bias. Applying radio frequency bias to the substrate involves supporting the substrate on a substrate holder having an electrode supplying a radio frequency bias to the substrate. For many embodiments, the radio frequency bias applied to the substrate is at the frequency range of between about 100 kHz and 27 MHz. The frequency range applied to the upper, plasma-generating electrode is typically between about 300 kHz and 27 MHz.

Although various details of the apparatus have been omitted for clarity's sake, various design alternatives may be implemented.

EXAMPLE

The following example provides details relating to performance advantages of the present invention. It should be understood the following is representative only, and that the invention is not limited by the detail set forth in this example.

Annealing Efficiency

Figure 7:
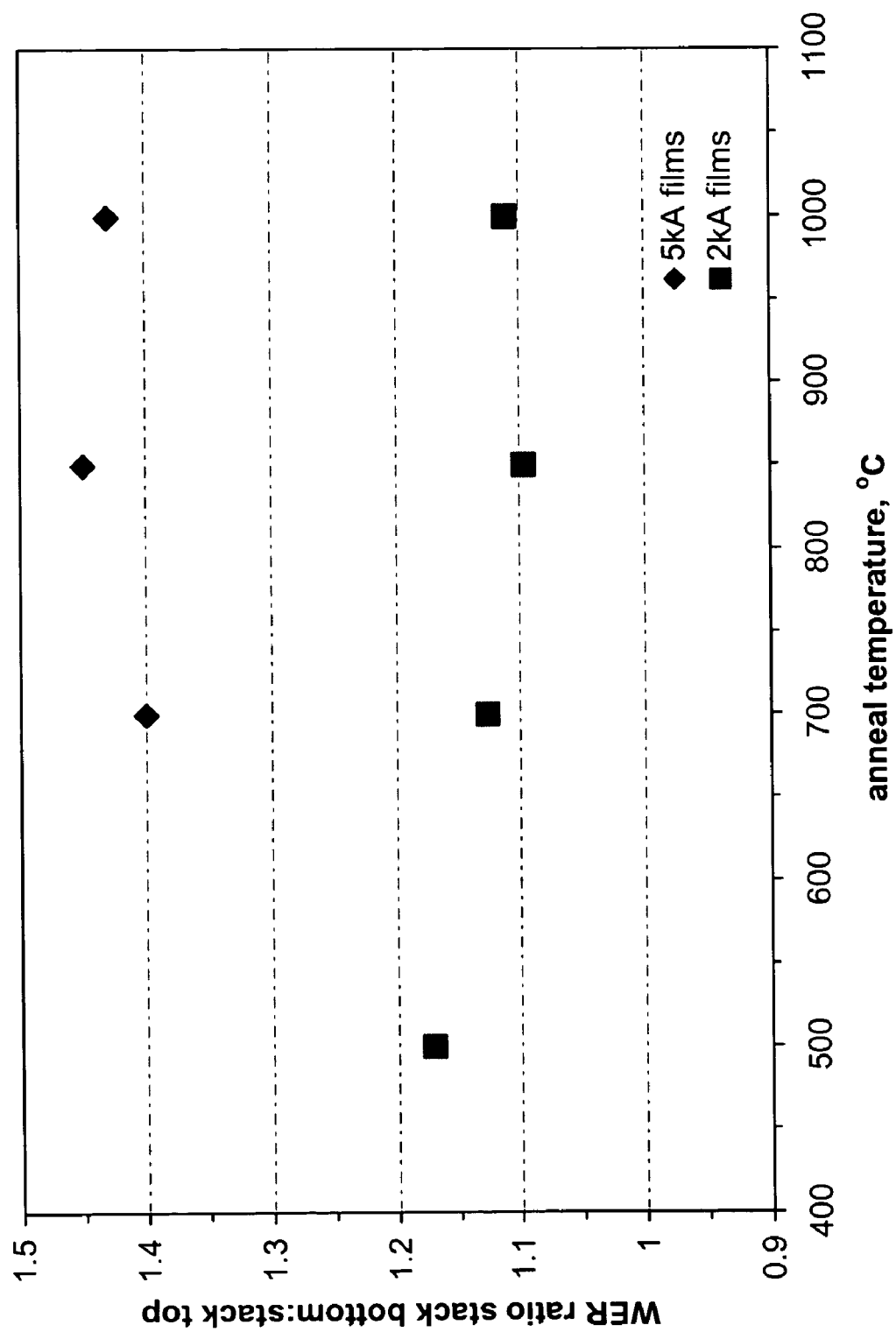
FIG. 7 is a plot showing the effect of film thickness on the efficiency of the densification (anneal) process, demonstrating the effectiveness of the present invention.

FIG. 7 shows the effect of film thickness on the efficiency of the densification (annealing) process. $SiO_2$ films were deposited by RVD using a silicon precursor partial pressure below 10 Torr and a temperature of 230° C. Films were annealed by RTP at the temperatures indicated for at least 5 minutes at ambient pressure in a mixture of 30% steam and 70% $N_2$. The films' wet etch rate, which is a measure of film density, was measured at the top and at the bottom of the stack. For the 5000 Å films, the difference is in the order of 40%, while for films 2000 Å thick the wet etch rate measurements were within 12% at temperatures above 700° C. This result indicates that the thinner films were more efficiently and uniformly densified from top to bottom.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. For example, while the invention has been described primarily with reference to a RVD/HDP embodiment herein, other deposition and anneal techniques can also be used in accordance with the invention. Also, while the invention has been described primarily in terms of preparing integrated circuits, it is not so limited. Accordingly, the present embodiments are to be considered as illustrative and not restrictive, and the invention is not to be limited to the details given herein, but may be modified within the scope and equivalents of the appended claims.

The entire disclosures of all references cited herein are incorporated by reference for all purposes.

What is claimed:

1. A method of forming a densified dielectric film, the method comprising:
   (a) depositing a silicon oxide-based dielectric film layer on a substrate;
   (b) annealing the dielectric film layer to remove water and densify the layer, wherein the annealing comprises a treatment with an annealing process agent selected from the group consisting of an oxygen-based plasma treatment and a UV-based treatment; and
(c) repeating (a) and (b) at least once to form the densified dielectric film;
wherein the thickness of the dielectric film layer formed in (a) is insufficient to prevent substantially complete penetration of an annealing process agent into the layer and migration of water out of the layer.

2. The method of claim 1, wherein the film layer thickness is between about 20 Å and 2 microns.

3. The method of claim 1, wherein the film layer thickness is between about 100 and 3000 Å.

4. The method of claim 1, wherein (a) comprises a thermal chemical vapor deposition of a silicon-containing precursor.

5. The method of claim 1, wherein (a) comprises an atomic layer deposition process.

6. The method of claim 1, wherein the annealing comprises a UV-based treatment.

7. The method of claim 1, wherein the annealing comprises treatment with an oxygen-containing plasma.

8. The method of claim 1, wherein the (a) and (b) are conducted in situ in a single reactor chamber.

9. The method of claim 1, wherein (a) comprises:
(i) exposing the substrate surface to a catalyst or catalyst-containing precursor gas to form a catalyst on the substrate surface; and
(ii) exposing the substrate surface to a silicon-containing precursor gas to form a silicon oxide-based dielectric film layer on the substrate.

10. The method of claim 9, wherein the silicon-containing precursor is at least one of a silanol and a silanediol.

11. The method of claim 9, wherein the catalyst or catalyst-containing precursor is a metal catalyst-containing precursor selected from the list of metal catalyst-containing precursors comprising aluminum, zirconium, hafnium, gallium, titanium, niobium, tantalum, and combinations thereof.

12. The method of claim 11, wherein the metal catalyst-containing precursor is at least one of hexakis(dimethylamino) aluminum and trimethyl aluminum.

13. The method of claim 1, wherein the annealing is conducted in an oxidizing environment.

14. The method of claim 13, wherein the oxidizing environment comprises one or more of oxygen, ozone, peroxide or nitrous oxide.

15. The method of claim 1, wherein the (a) and (b) are conducted in separate reactor chambers.

16. The method of claim 15, wherein the separate reactor chambers are integrated in a single apparatus.

17. The method of claim 1, wherein the substrate is a partially fabricated semiconductor wafer.

18. The method of claim 17, wherein the dielectric film is deposited over gaps in the partially fabricated semiconductor wafer.

19. A method of forming a densified dielectric film, the method comprising:
(a) exposing a substrate surface to a catalyst or catalyst-containing precursor gas to form a catalyst on the substrate surface;
(b) exposing the substrate surface to a silicon-containing precursor gas to form a silicon oxide-based dielectric film layer on the substrate;
(c) repeating (a) and (b) at least once to form a dielectric film; and
(d) annealing the dielectric film to remove water and densify the film, wherein the annealing comprises a treatment with an annealing process agent selected from the group consisting of an oxygen-based plasma treatment, and a UV-based treatment;
wherein the thickness of the dielectric film formed in (c) is insufficient to prevent substantially complete penetration of an annealing process agent into the film and migration of water out of the film.

20. The method of claim 19, wherein the annealing comprises an oxygen-containing plasma-based treatment.

21. The method of claim 19, wherein the annealing comprises a UV-based treatment.

22. The method of claim 19, wherein the annealing comprises treatment with an oxygen-containing plasma.

23. A method of forming a densified dielectric film, the method comprising:
(a) depositing a silicon oxide-based dielectric film layer on a substrate;
(b) annealing the dielectric film layer to remove water and densify the layer, wherein the annealing comprises a treatment with an annealing process agent selected from the group consisting of an oxygen-based plasma treatment and a UV-based treatment; and
wherein the thickness of the dielectric film layer formed in (a) is insufficient to prevent substantially complete penetration of an annealing process agent into the layer and migration of water out of the layer.

* * * * *